(12) United States Patent
Shin et al.

(10) Patent No.: US 9,564,451 B1
(45) Date of Patent: Feb. 7, 2017

(54) SEMICONDUCTOR DEVICE AND MANUFACTURING METHOD THEREOF

(71) Applicant: SK hynix Inc., Icheon-si, Gyeonggi-do (KR)

(72) Inventors: Hack Seob Shin, Icheon-si (KR); Sang Hyuk Nam, Cheongju-si (KR); Byung Soo Park, Suwon-si (KR); Jong Ho Jung, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/094,016

(22) Filed: Apr. 8, 2016

(30) Foreign Application Priority Data

Nov. 6, 2015 (KR) .......................... 10-2015-0156055

(51) Int. Cl.
| | |
|---|---|
| H01L 23/48 | (2006.01) |
| H01L 27/115 | (2006.01) |
| H01L 23/535 | (2006.01) |
| H01L 23/522 | (2006.01) |
| H01L 23/528 | (2006.01) |
| H01L 21/768 | (2006.01) |
| H01L 21/48 | (2006.01) |

(52) U.S. Cl.
CPC ..... H01L 27/11582 (2013.01); H01L 21/4846 (2013.01); H01L 21/76897 (2013.01); H01L 23/528 (2013.01); H01L 23/5226 (2013.01); H01L 23/535 (2013.01)

(58) Field of Classification Search
CPC ............ H01L 2924/01078; H01L 2924/01079; H01L 2924/01029; H01L 23/48; H01L 23/52; H01L 23/481; H01L 23/5226

USPC ......................................................... 257/774
See application file for complete search history.

(56) References Cited

U.S. PATENT DOCUMENTS

2015/0340374 A1* 11/2015 Jung ................. H01L 27/11573
438/258

FOREIGN PATENT DOCUMENTS

KR     1020140137632 A     12/2014

* cited by examiner

*Primary Examiner* — Monica D Harrison
(74) *Attorney, Agent, or Firm* — William Park & Associates Ltd.

(57) ABSTRACT

A semiconductor device may include a substrate, conductive patterns stacked to be spaced apart from each other on the substrate, contact plugs coming in contact with the respective conductive patterns, and first and second slit insulating layers of a first group penetrating the conductive patterns. The substrate may include a cell area and a contact area extending along a first direction from the cell area. The conductive patterns may be form a step structure. The first slit insulating layers of the first group may be opposite to each other in a second direction with any one of the contact plugs, interposed therebetween. The second slit insulating layers of the first group, which extend along the first direction in the contact area, may be opposite to each other in the second direction with the first slit insulating layers of the first group and the contact plugs, interposed therebetween.

19 Claims, 33 Drawing Sheets

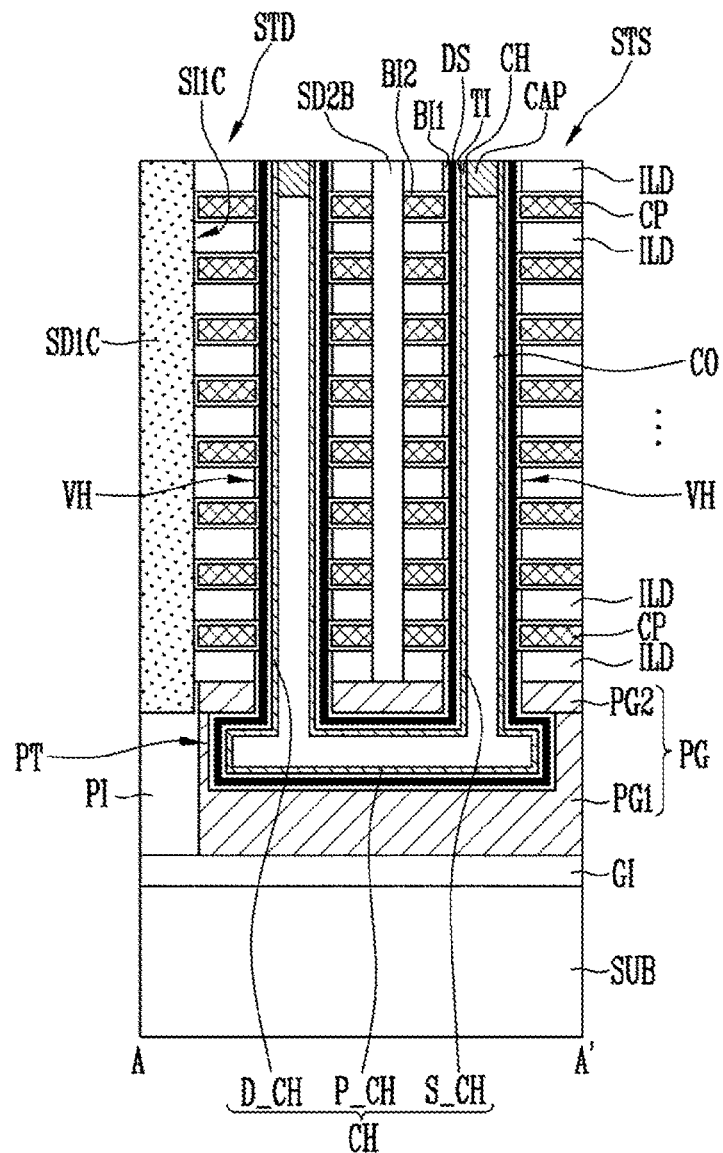

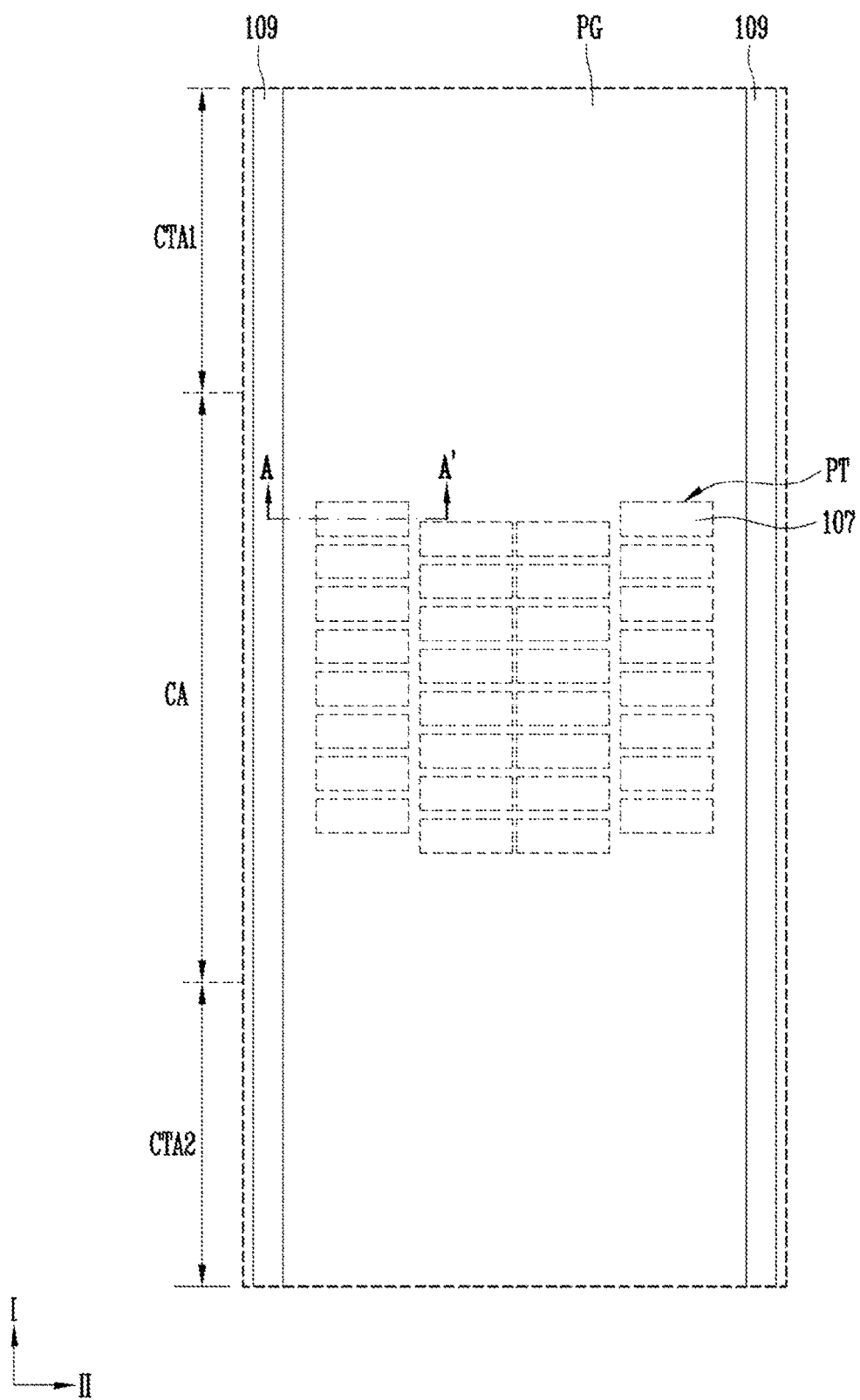

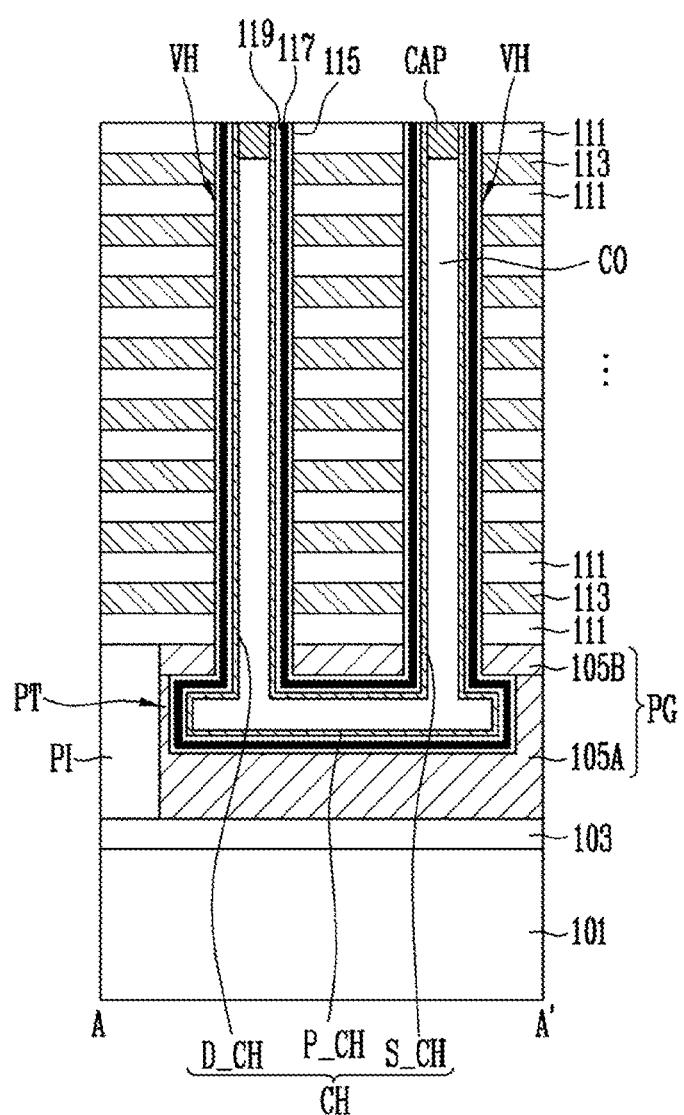

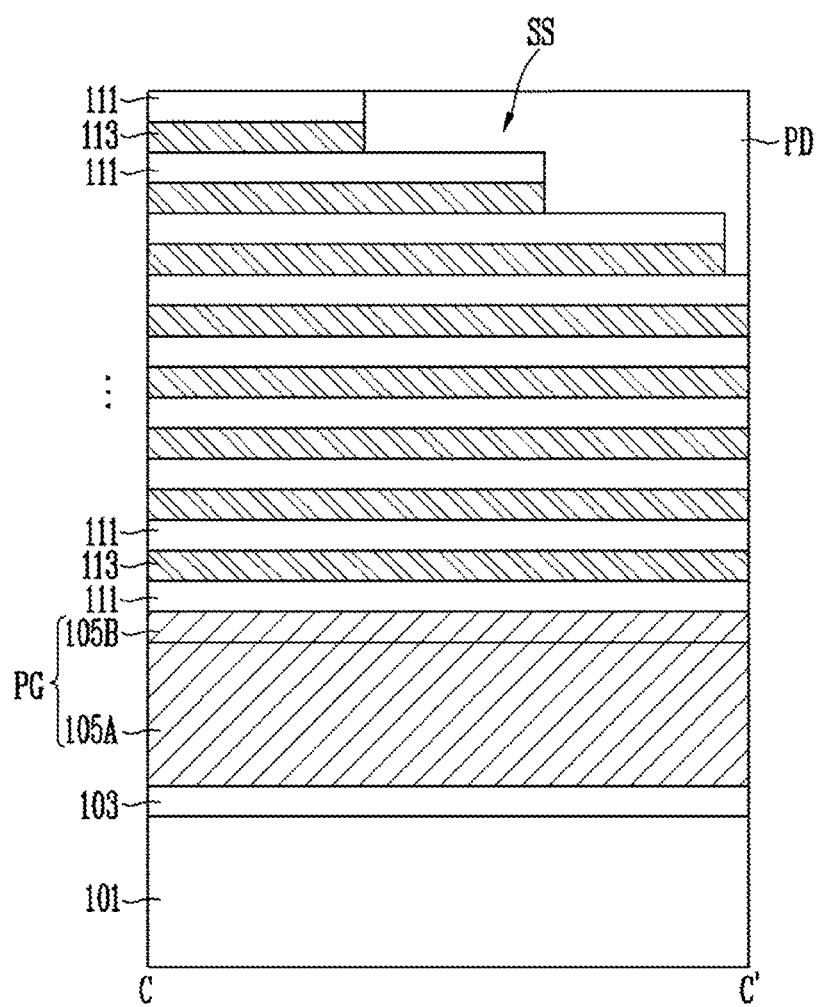

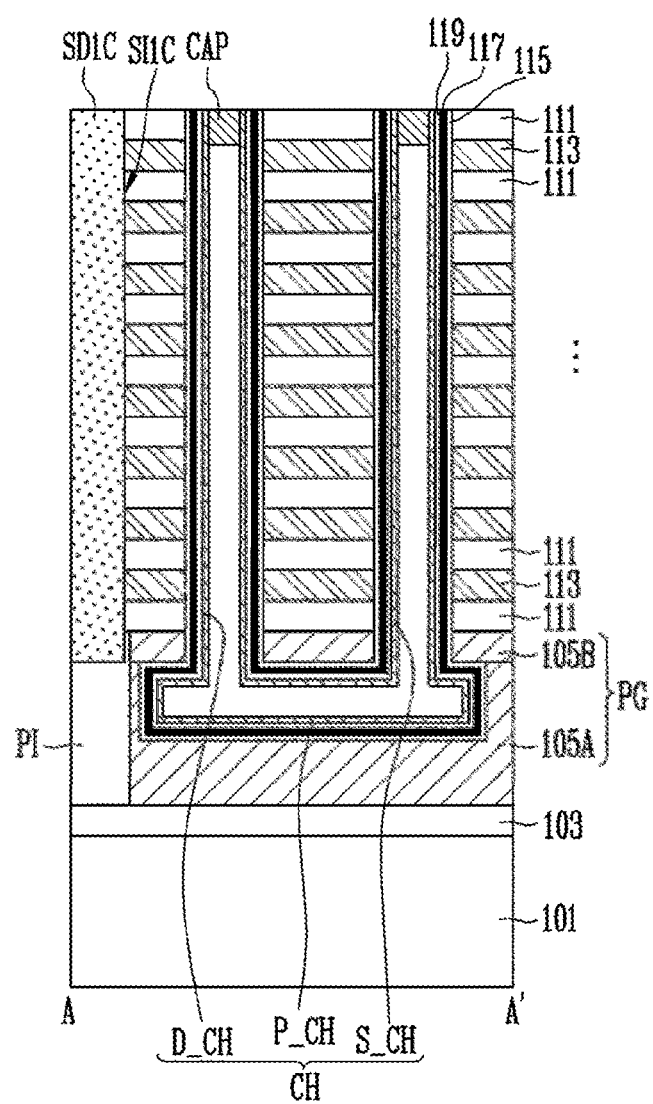

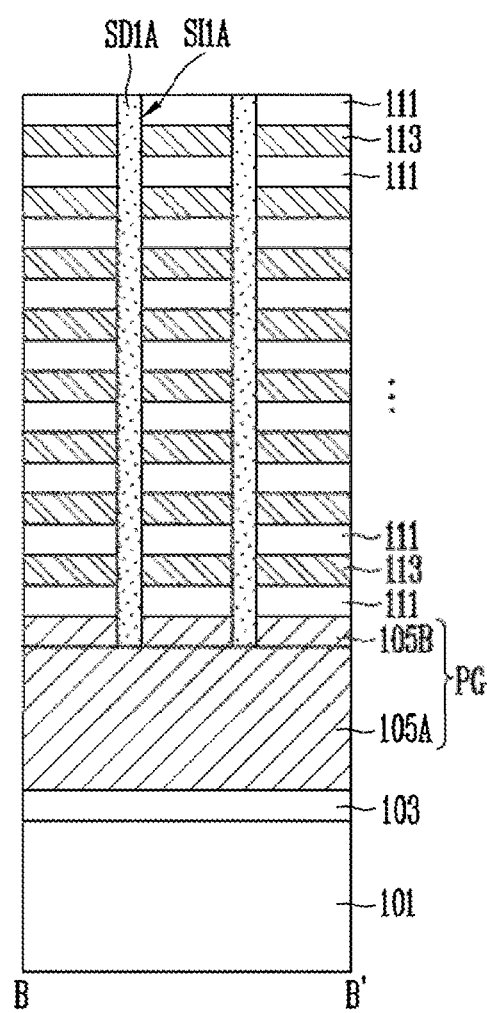

| # SEMICONDUCTOR DEVICE AND MANUFACTURING METHOD THEREOF

CROSS-REFERENCE TO RELATED APPLICATION

The present application claims a priority under 35 U.S.C. §119(a) to Korean patent application number 10-2015-0156055 filed on Nov. 6, 2015, in the Korean Intellectual Property Office, the entire disclosure of which is herein incorporated by reference.

BACKGROUND

1. Technical Field

An aspect of the present disclosure generally relates to a semiconductor device and a manufacturing method thereof, and more particularly to a three-dimensional semiconductor memory device and a manufacturing method thereof.

2. Related Art

The miniaturization of semiconductor devices has been made possible by reducing the feature size of the semiconductor devices. In recent years, the size limit for the feature size has made a three-dimensional semiconductor device the key to further miniaturization.

The three-dimensional memory device may include interlayer insulating layers and conductive patterns, which are alternately stacked on a substrate. A process of forming a stacked structure of interlayer insulating layers and conductive patterns may include alternately stacking interlayer insulating layers and sacrificial insulating layers, selectively removing the sacrificial insulating layers, and filling conductive patterns in areas in which the sacrificial insulating layers are removed.

However, the interlayer insulating layers may be collapsed or warped while removing the sacrificial insulating layers. As a result, it may be difficult for the interlayer insulating layers to maintain their intervals, and thus it may also be difficult to provide a stable stacked structure in a process of manufacturing a three-dimensional semiconductor memory device.

SUMMARY

In an embodiment, a semiconductor device may include a substrate, conductive patterns, contact plugs, first slit insulating layers of a first group, and second slit insulating layers of a first group. The substrate may include a cell area and a contact area extending along a first direction from the cell area. The conductive patterns may be stacked to be spaced apart from each other on the substrate and forming a step structure in the contact area. The contact plugs may come in contact with the respective conductive patterns and extend along a direction along which the conductive patterns are stacked. The first slit insulating layers of a first group may be disposed opposite to each other in a second direction intersecting the first direction. Any one of the contact plugs may be interposed between the first slit insulating layers of the first group. The first slit insulating layers of a first group may penetrate the conductive patterns. The second slit insulating layers of a first group may extend along the first direction in the contact area to penetrate the conductive patterns, and be disposed opposite to each other in the second direction. The first slit insulating layers of the first group and the contact plugs may be interposed between the second slit insulating layers of the first group.

In an embodiment, a method of manufacturing a semiconductor device may include alternately stacking first material layers and second material layers on a substrate including a cell area and a contact area extending along a first direction from the cell area, forming a step structure on the contact area by etching at least a portion of the first material layers and the second material layers, forming a planarization insulating layer covering the step structure, forming, in the contact area, first slit insulating layers of a first group, which penetrate the planarization insulating layer, the first material layers, and the second material layers, and are disposed opposite to each other in a second direction intersecting the first direction, and forming second slits of a first group, which extend along the first direction to penetrate the first material layers and the second material layers, and are disposed opposite each other in the second direction with the first slit insulating layers of the first group adjacent to each other, which are interposed therebetween.

BRIEF DESCRIPTION OF THE DRAWINGS

FIGS. 4A to 4D are diagrams illustrating an example of a semiconductor device according to an embodiment of the present disclosure.

DETAILED DESCRIPTION

Figure 1:
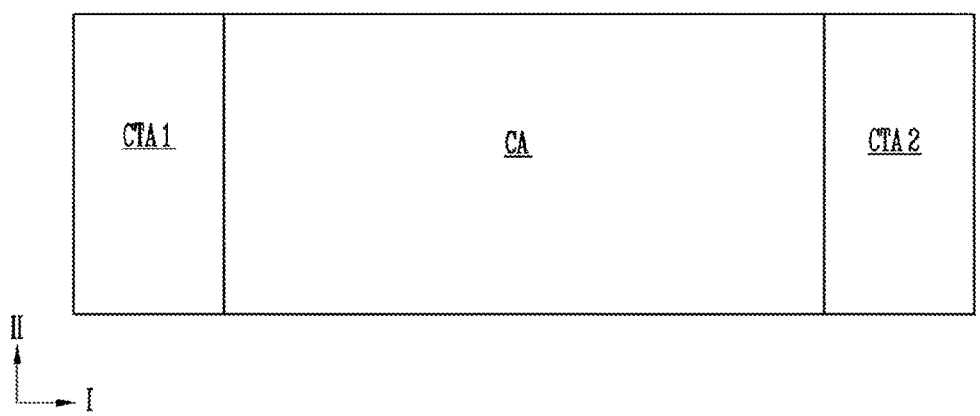
FIG. 1 is a plan view illustrating an example layout of a cell area and contact areas of a semiconductor device according to an embodiment of the present disclosure.

Embodiments provide a semiconductor device and a manufacturing method thereof, which can reinforce the structural stability of a stacked structure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art.

FIG. 1 is a plan view illustrating an example layout of a cell area and contact areas of a semiconductor device according to an embodiment of the present disclosure.

Referring to FIG. 1, the semiconductor device according to an embodiment of the present disclosure may include a cell area CA and contact areas CTA1 and CTA2 extending along a first direction I from the cell area CA.

A memory cell array may be disposed in the cell area CA. The memory cell array may include memory blocks. Each of the memory blocks may include memory cells. Each of the memory cells may store one or more bits. In an embodiment, each memory block may include memory strings each having memory cells connected in series through a channel layer. One end of the channel layer may be coupled to a bit line, and the other end of the channel layer may be coupled to a common source line or a source area. The channel layer may be surrounded by conductive patterns. The conductive patterns may be stacked to be spaced apart from each other on a substrate. More specifically, the conductive patterns may be stacked on top of one another interleaved with interlayer insulating layers. The conductive patterns are coupled to gates of the memory cells. The conductive patterns may extend toward the contact areas CTA1 and CTA2 from the cell area CA along the first direction I. The conductive patterns may form a step structure on each of the contact areas CTA1 and CTA2.

A memory string formed on the cell area CA may be formed in various structures. For example, the memory string may be formed in a straight-type structure, a U-type structure, or a W-type structure. Structures of the memory string will be described in detail later with reference to FIGS. 2 and 13.

The contact areas CTA1 and CTA2 may include a first contact area CTA1 and a second contact area CTA2, and the conductive patterns may extend from the cell area CA to the contact areas CTA1 and CTA2. In an embodiment, the contact areas CTA1 and CTA2 may be symmetrical about the cell area CA. The cell area CA may be interposed between the contact areas CTA1 and CTA2.

Figure 2:
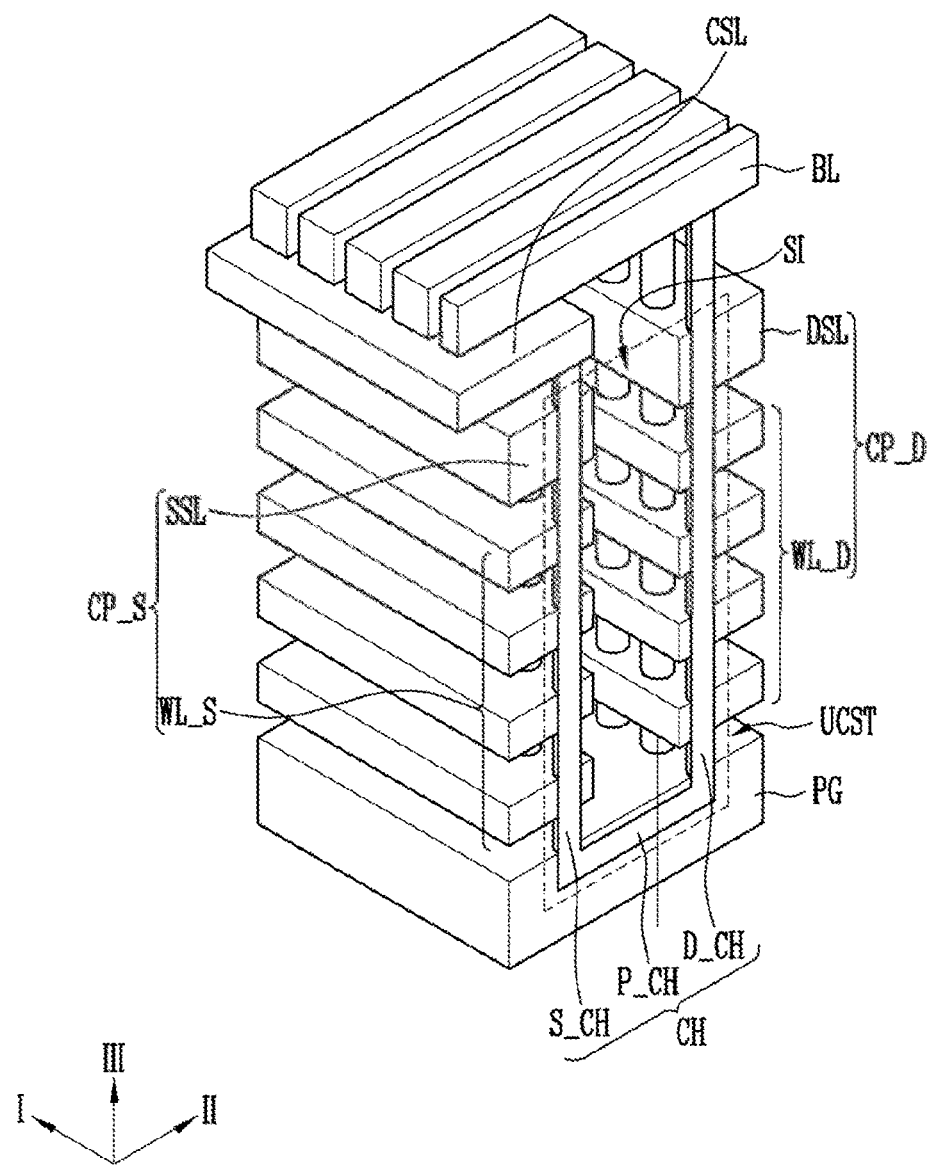
FIG. 2 is a perspective view illustrating an example of a structure of a memory string of a semiconductor device according to an embodiment of the present disclosure.

FIG. 2 is a perspective view illustrating an example of a structure of a memory string of a semiconductor device according to an embodiment of the present disclosure. For convenience of illustration, a plurality of insulating layers including tunnel insulating layers, data storage layers, blocking insulating layers, and interlayer insulating layers have been omitted from FIG. 2.

Referring to FIG. 2, each memory block of a memory cell array may include a U-type memory string UCST. The U-type memory string UCST may include a U-type string channel layer CH, conductive patterns CP_S and CP_D, and a pipe gate PG. The conductive patterns CP_S and CP_D may be stacked to be spaced apart from each other. In other words, the conductive patterns CP_S and CP_D may be stacked on top of one another interleaved with interlayer insulating layers (not illustrated). The conductive patterns CP_S and CP_D each may surround the string channel layer CH. The pipe gate PG may be disposed under the conductive patterns CP_S and CP_D, and may surround the string channel layer CH.

The string channel layer CH may include a pipe channel layer P_CH embedded in the pipe gate PG, and a source-side channel layer S_CH and a drain-side channel layer D_CH, which extend from the pipe channel layer P_CH. The string channel layer CH may be formed in a tubular shape surrounding a core insulating layer formed in a central area of a U-shaped hole. Alternatively, the string channel layer CH may be formed by completely filling the central area of the U-shaped hole.

Although not illustrated, the outer wall of the string channel layer CH may be surrounded by a tunnel insulating layer, a data storage layer, and a blocking insulating layer. The tunnel insulating layer may come in contact with the outer wall of the string channel layer CH, and may be formed along the shape of the outer wall of the string channel. The data storage layer may come in contact with the outer wall of the tunnel insulating layer, and may be formed along the shape of the outer wall of the tunnel insulating layer. The blocking insulating layer may be divided into a first blocking insulating layer and a second blocking insulating layer. The first blocking insulating layer may be disposed between the string channel layer CH and one of interlayer insulating layers, and the second blocking insulating layer may be disposed between the string channel layer CH and one of the conductive patterns CP_S and CP_D. Structures of the tunnel insulating layer, the data storage layer, the blocking insulating layer, and the interlayer insulating layers will be described in detail later with reference to FIGS. 4A to 4D.

The string channel layer CH may be electrically connected between a common source line CSL and a bit line BL. The bit line BL and the common source line CSL are disposed in different layers, and spaced apart from each other. The bit line BL may be electrically connected to a top end of the drain-side channel layer D_CH, and extend along a second direction II intersecting the first direction I. A contact plug may be formed between the bit line BL and the drain-side channel layer D_CH. The common source line CSL may be electrically connected to a top end of the source-side channel layer S_CH. A contact plug may be formed between the common source line CSL and the source-side channel layer S_CH.

The pipe gate PG is disposed under the bit line BL, the common source line CSL, and the conductive patterns CP_s and CP_D, and may be formed to surround the pipe channel layer P_CH.

The conductive patterns CP_S and CP_D may include source-side conductive patterns CP_S and drain-side conductive patterns CP_D, which are separated by a slit SI. The source-side conductive patterns CP_S and the drain-side conductive patterns CP_D may be disposed under the bit line BL and the common source line CSL.

The source-side conductive patterns CP_S may include source-side word lines WL_S and a source select line SSL, which are sequentially stacked along the source-side channel layer S_CH. For example, the source-side word lines WL_S may be stacked on top of one another interleaved with interlayer insulating layers (not illustrated), and the source select line SSL may be disposed on an interlayer insulating layer formed on the uppermost source-side word line WL_S. The source-side word lines WL_S may be disposed between the common source line CSL and the pipe gate PG. The source select line SSL may be disposed between the common source line CSL and the source-side word lines WL_S.

The number of source select lines SSL stacked between the common source line CSL and the source-side word lines WL_S may be one. Alternatively, the number of source select lines SSL stacked between the common source line CSL and the source-side word lines WL_S may be two or more.

The drain-side conductive patterns CP_D may include drain-side word lines WL_D and a drain select line DSL, which are sequentially stacked along the drain-side channel layer D_CH. For example, the side word lines WL_D may be stacked on top of one another interleaved with interlayer insulating layers (not illustrated), and the drain select line DSL may be disposed on an interlayer insulating layer formed on the uppermost side word line WL_D. The drain-side word lines WL_D may be disposed between the bit line BL and the pipe gate PG. The drain select line DSL may be disposed between the bit line BL and the drain-side word lines WL_D. The number of drain select lines DSL stacked between the bit line BL and the drain-side word lines WL_D may be one. Alternatively, the number of drain select lines DSL stacked between the bit line BL and the drain-side word lines WL_D may two or more.

The conductive patterns CP_S and CP_D may include edges that extend toward the contact areas CTA1 and CTA2 described in FIG. 1, and form step structures on the contact areas CTA1 and CTA2. The step structure of the conductive patterns CP_S and CP_D will be described later with reference to FIG. 3.

According to the above-described structure, source-side memory cells are formed at intersection portions of the source-side channel layer S_CH and the source-side word lines WL_S, and drain-side memory cells are formed at intersection portions of the drain-side channel layer D_CH and the drain-side word lines WL_S. A source select transistor is formed at an intersection portion of the source-side channel layer S_CH and the source select line SSL, and a drain select transistor is formed at an intersection portion of the drain-side channel layer D_CH and the drain select line DSL. A pipe transistor is formed at an intersection portion of the pipe channel layer P_CH and the pipe gate PG. A source select transistor, source-side memory cells, a pipe transistor, drain-side memory cells, and a drain select transistor, which are arranged along a string channel layer CH may be connected in series through the string channel layer CH. Accordingly, a U-type memory string UCST in accordance with an embodiment may include the source select transistor, the source-side memory cells, the pipe transistor, the drain-side memory cells, and the drain select transistor, which are connected through the string channel layer CH. The source-side word lines WL_S may transmit signals to gates of the source-side memory cells, and the drain-side word lines WL_D may transmit signals to gates of the drain-side memory cells. The source select line SSL may transmit signals to a gate of the source select transistor, and the drain select line DSL may transmit signals to a gate of the drain select transistor. The pipe gate PG may transmit signals to a gate of the pipe transistor.

The string channel layer CH may be formed in various structures such as a W-type structure in addition to the U-type structure described in FIG. 2. The structure of the memory string may vary depending on structures of the string channel layer CH.

Figure 3:
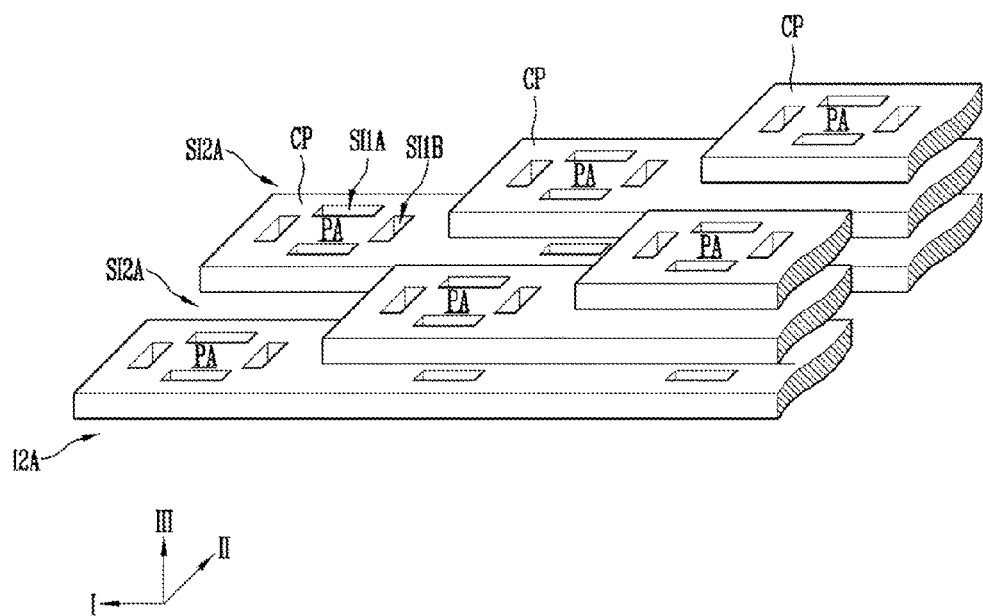
FIG. 3 is a perspective view illustrating examples of conductive patterns of a semiconductor device according to an embodiment of the present disclosure.

FIG. 3 is a perspective view illustrating examples of conductive patterns of a semiconductor device according to an embodiment of the present disclosure. FIG. 3 illustrates some of conductive patterns stacked on a contact area.

Referring to FIG. 3, the conductive patterns CP may be stacked to be spaced apart from each other while forming a step structure in the contact area. In an embodiment, the conductive patterns CP may form a multi-step structure at one or more sides thereof. For example, in a case where the conductive patterns CP consist of three conductive patterns, the uppermost has the shortest length, the middle has an intermediate length, and the lowermost has the longest length. In other words, the conductive patterns CP may extend long along the first direction I as they downwardly approach the substrate, thereby forming the multi-step structure.

Pad areas PA may be defined at end portions of the conductive patterns CP forming a step structure (e.g., multi-step structure). The pad areas PA exposed through the step structure may be connected to contact plugs.

As described above, the conductive patterns CP including the pad areas PA may be penetrated by first slits SI1A of a first group. The first slits SI1A of the first group are disposed opposite to each other in the second direction II with each of the pad areas PA, which is interposed therebetween. That is, each of the pad areas PA is disposed between the first slits SI1A of the first group, which are disposed opposite to each other in the second direction II. The first slits SI1A of the first group extend along a third direction III along which the conductive patterns CP are stacked. The first slits SI1A of the first group may extend to penetrate a lowermost conductive pattern in the stacked structure of the conductive patterns CP. The number of the conductive patterns CP penetrated by the first slits SI1A of the first group may vary. For example, first types, among the first slits SI1A of the first group, which penetrate an uppermost conductive pattern in the stacked structure of the conductive patterns CP, extend along the third direction III until they penetrate the lowermost conductive pattern. Therefore, the first types may penetrate all the middle patterns between the lowermost conductive pattern and the uppermost conductive pattern. Second types, among the first slits SI1A of the first group, which are opposite to each other the pad area of the lowermost conductive pattern, which is interposed therebetween, may penetrate only the lowermost conductive pattern.

The conductive patterns CP may be penetrated by second slits SI2A of the first group. The second slits SI2A of the first group extend along the first direction I, and may be disposed opposite to each other in the second direction II with the first slits SI1A adjacent to each other in the second direction II and the pad areas PA disposed between the first slits SI1A, which are interposed therebetween.

According to the above-described structure, at least one of the first slits SI1A of the first group may be disposed between each of the pad areas PA and second slits SI2A of the first group.

The conductive patterns CP may be penetrated by first slits SI1B of a second group. The first slits SI1B of the second group are disposed opposite to each other in the first direction I with each of the pad areas PA, which is interposed therebetween. In addition, the first slits SI1B of the second group, which are adjacent to each other with any one of the pad areas PA, which is interposed therebetween, are disposed between the second slits SI2A of the first group. The first slits SI1B of the second group extend along the third direction III along which the conductive patterns CP are stacked, and may extend to penetrate the lowermost conductive pattern among the conductive patterns CP. The number of the conductive patterns CP penetrated by the first slits SI1B of the second group may vary. For example, first types, among the first slits SI1B of the second group, which penetrate the uppermost conductive pattern among the conductive patterns CP, extend along the third direction III until they penetrate the lowermost conductive pattern. Therefore, the first types may penetrate all the middle conductive patterns between the lowermost conductive pattern and the uppermost conductive pattern. Second types among the first slits SI1B of the second group, which are opposite to each other with the pad area of the lowermost conductive pattern, which is interposed therebetween, may penetrate only the lowermost conductive pattern.

The first slits SI1A of the first group, the second slits SI2A of the first group, and the first slits SI1B of the second group may be spaced apart from each other in the conductive patterns CP.

According to the above-described structure, each of the pad areas PA of the conductive patterns CP is surrounded by the first slits SI1A of the first group and the first slits SI1B of the second group, which are spaced apart from each other.

A semiconductor device according to an embodiment of the present disclosure, which has conductive patterns and slits, including the above-described arrangement structure on a contact area, will be described in detail with reference to FIGS. 4A to 4D.

Figure 4A:
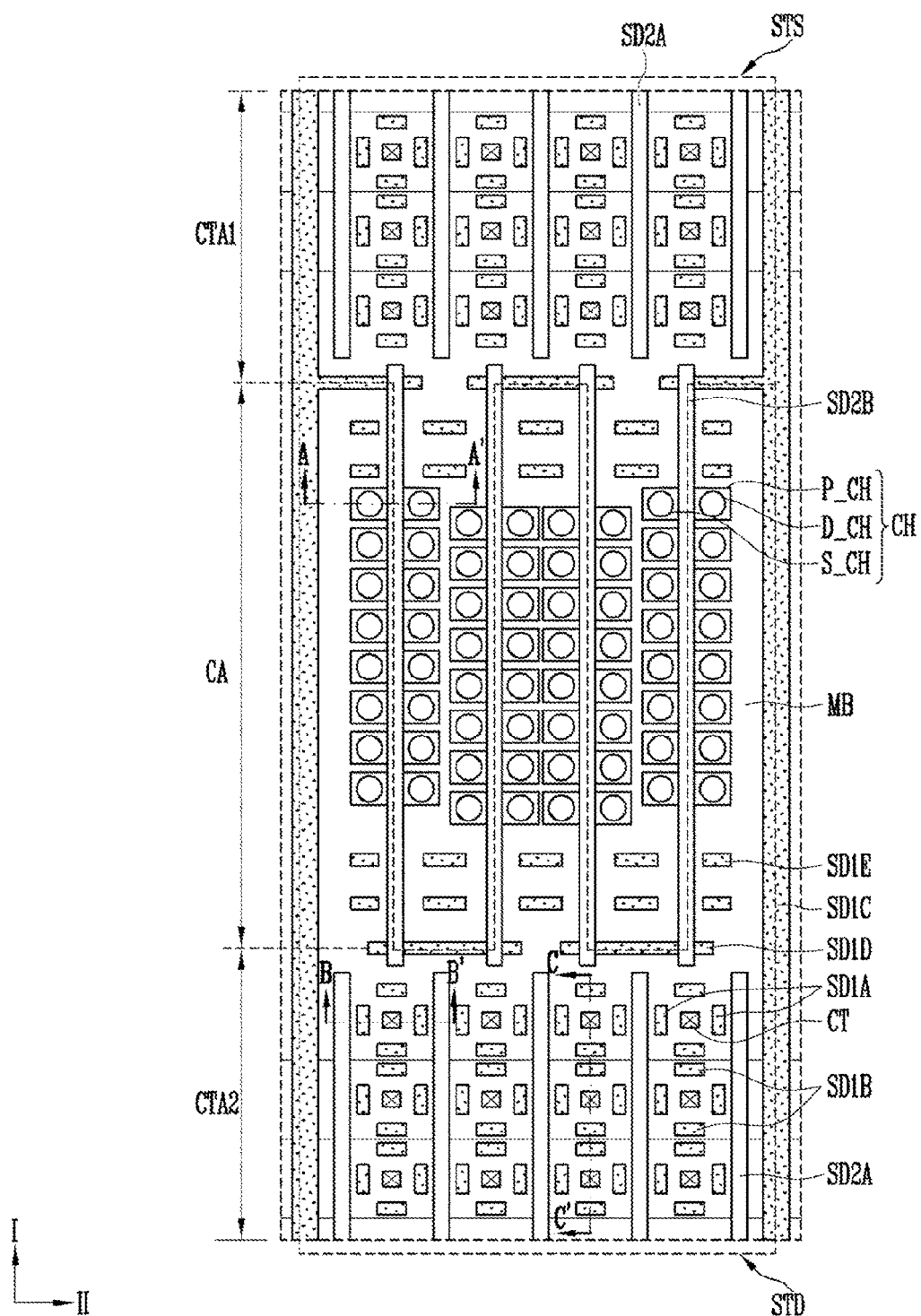
Figure 4C:
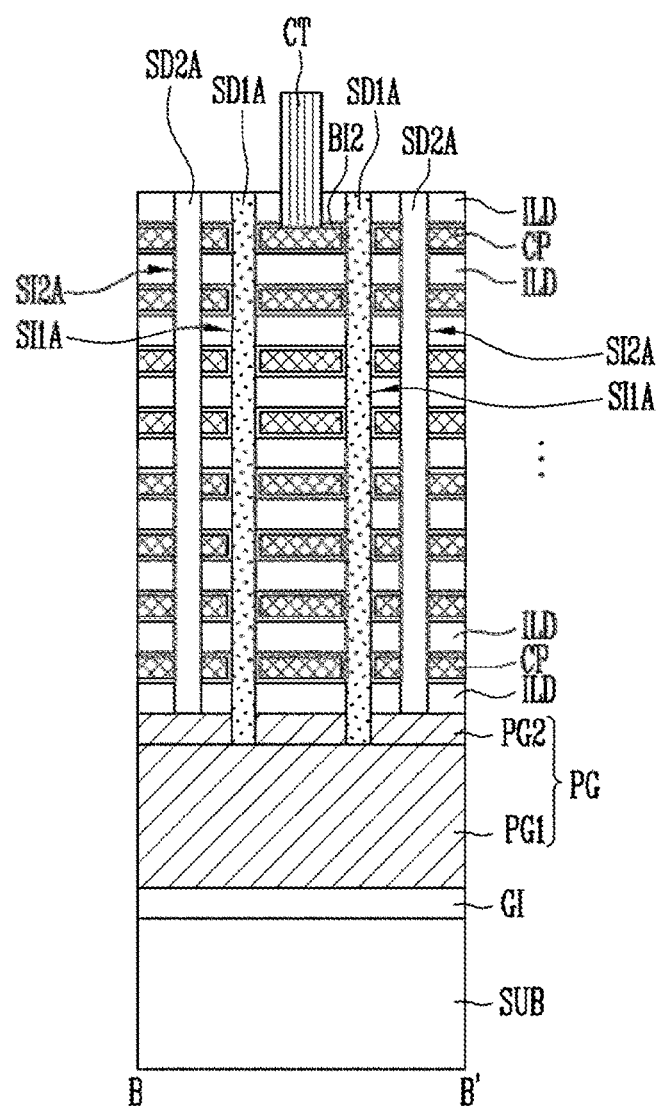
Figure 4D:
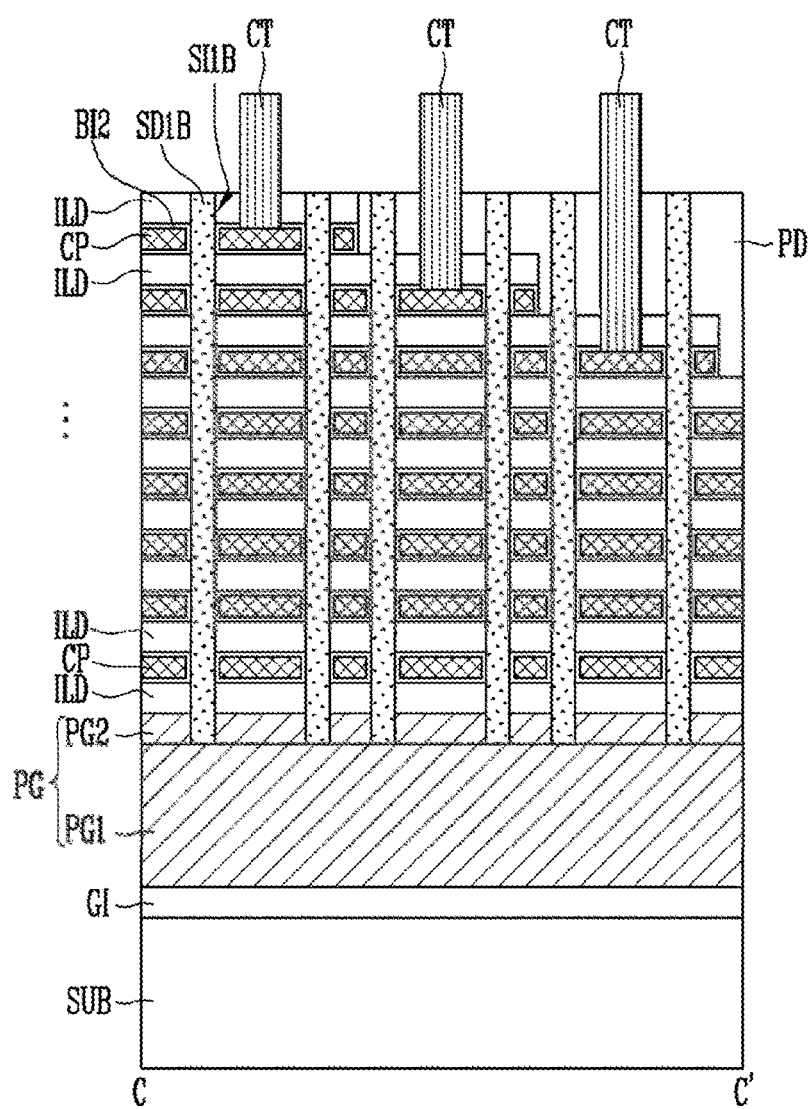

FIGS. 4A to 4D are diagrams illustrating an example of a semiconductor device according to an embodiment of the present disclosure. FIG. 4A is a plan view of the semiconductor device according to an embodiment of the present disclosure. FIG. 4B is a sectional view taken along line A-A' of FIG. 4A. FIG. 4C is a sectional view taken along line B-B' of FIG. 4A. FIG. 4D is a sectional view taken along line C-C' of FIG. 4A.

Referring to FIG. 4A, the semiconductor device may include a substrate SUB that is divided into a cell area CA and first and second contact areas CTA1 and CTA2 extending in the first direction I from both sides of the cell area CA, and a stacked structure of a memory block MB disposed on the substrate SUB.

The stacked structure of the memory block MB may include a source-side stacked structure STS and a drain-side stacked structure STD, which are separated from each other. Each of the source-side stacked structure STS and the drain-side stacked structure STD may extend to at least one of the first and second contact areas CTA1 and CTA2 from the cell area CA. For example, the source-side stacked structure STS may extend to the first contact area CTA1 from the cell area CA, and the drain-side stacked structure STD may extend to the second contact area CTA2 from the cell area CA.

Each of the source-side stacked structure STS and the drain-side stacked structure STD may include a step-structure edge on at least one of the first and second contact areas CTA1 and CTA2. Hereinafter, for convenience purposes only, each edge of the source-side stacked structure STS and the drain-side stacked structure STD, which are respectively disposed on the first and second contact areas CTA1 and CTA2, is referred to as a stepped edge of the stacked structure of the memory block MB.

Contact plugs CT are disposed on the stepped edge of the stacked structure of the memory block MB. The contact plugs CT may transmit signals from external devices to conductive patterns constituting the stacked structure of the memory block MB. The contact plugs CT are connected to conductive patterns exposed through the stepped edge of the stacked structure of the memory block MB. The connection between the contact plugs CT and the conductive patterns will be described later with reference to FIGS. 4C and 4D.

The contact plugs CT may be arranged in a matrix form on the stepped edge of the stacked structure of the memory block MB.

The stacked structure of the memory block MB may be penetrated by first slits and second slits. The first slits are filled with first slit insulating layers SD1A to SD1E, and the second slits are filled with second slit insulating layers SD2A and SD2B. The stacked structure of the memory block MB may be penetrated by a string channel layer CH disposed on the cell area CA. The string channel layer CH, as described in FIG. 2, may include a source-side channel layer S_CH, a drain-side channel layer D_CH, and a pipe channel layer P_CH connecting the source-side channel layer S_CH and the drain-side channel layer D_CH to each other. The source-side channel layer S_CH penetrates the source-side stacked structure STS, and the drain-side channel layer D_CH penetrates the drain-side stacked structure STD.

The first slit insulating layers SD1A to SD1E serve as supports of the stacked structure of the memory block MB, and may be simultaneously formed. The first slit insulating layers may be divided into first slit insulating layers SD1A to SD1E of first to fifth groups.

First slit insulating layers SD1A of the first group may be formed in the first slits SI1A of the first group illustrated in FIG. 3, and disposed in each of the first and second contact areas CTA1 and CTA2. In an embodiment, the first slit insulating layers SD1A of the first group may be symmetrical about each of the contact plugs CT. For example, the first slit insulating layers SD1A of the first group are disposed at opposite sides of each of the contact plugs CT in the second direction II. In other words, the first slit insulating layers SD1A of the first group are disposed opposite to each other in the second direction II with each of the contact plugs CT, which is interposed therebetween. That is, any one of the contact plug is disposed between a pair of first slit insulating layers SD1A of the first group, which are arranged in the second direction II. First slit insulating layers SD1B of the second group are formed in the first slits SI1B of the second group illustrated in FIG. 3, and disposed in each of the first and second contact areas CTA1 and CTA2. In an embodiment, the first slit insulating layers SD1B of the second group may be symmetrical about each of the contact plugs CT. For example, the first slit insulating layers SD1B of the second group are disposed at opposite sides of each of the contact plugs CT in the first direction I. In other words, the first slit insulating layers SD1B of the second group are disposed opposite to each other in the first direction I with each of the contact plugs CT, which is interposed therebetween. That is, any one of the contact plugs CT is disposed between a pair of first slit insulating layers SD1B of the second group, which are arranged in the first direction I. As discussed above, each of the contact plug CT is surrounded by the first slit insulating layers SD1A and SD1B of the first and second groups. In other words, each of the contact plugs CT is disposed to come in contact with a pad area of each of the conductive patterns, which is defined by a pair of first slit insulating layers SD1A of the first group and a pair of first slit insulating layers SD1B of the second group.

First slit insulating layers SD1C of the third group separate the conductive patterns into the stacked structure of the memory block MB as a memory block unit, and define edges of the stacked structure of the memory block MB. The first slit insulating layers SD1C of the third group may extend along the first direction I, and may be arranged opposite to each other in the second direction II.

First slit insulating layers SD1D of the fourth group are formed through the stacked structure of the memory block MB along boundaries between the cell area CA and the first and second contact areas CTA1 and CTA2. First contact area-side first slit insulating layers SD1D of the fourth group, which are disposed along the boundary of the cell area CA and the first contact area CTA1, may be arranged in zigzag fashion with second contact area-side first slit insulating layers SD1D of the fourth group, which are disposed along the boundary of the second contact area CTA2 and the cell area CA. Edge patterns adjacent to the first slit insulating layers SD1C of the third group among the first contact area-side first slit insulating layers SD1D of the fourth group are connected to the first slit insulating layers SD1C of the third group. The second contact area-side first slit insulating layers SD1D of the fourth group are spaced apart from the first slit insulating layers SD1C of the third group.

First slit insulating layers SD1E of the fifth group may be disposed on edges of the cell area CA to serve as supports.

The first slit insulating layers SD1A of the first group, the first slit insulating layers SD1B of the second group, the first slit insulating layers SD1C of the third group, and first slit insulating layers SD1E of the fifth group are spaced apart from each other. The first slit insulating layers SD1D of the fourth group are spaced apart from each other, and some of the first slit insulating layers SD1D of the fourth group may be connected to the first slit insulating layers SD1C of the third group.

The second slit insulating layers SD2A and SD2B are formed in the second slits, and may be simultaneously formed. The second slits may provide paths through which material layers constituting the stacked structure of the memory block MB come into. The second slit insulating layers may be divided into second slit insulating layers SD2A and SD2B of first and second groups.]

Second slit insulating layers SD2A of the first group may be formed in the second slits SI2A of the first group illustrated in FIG. 3, may extend along the first direction I, and may be disposed in each of the first and second contact areas CTA1 and CTA2. In an embodiment, the second insulating layers SD2A of the first group may be symmetrical about each of the contact plugs CT. For example, the second insulating layers SD2A of the first group are disposed in the second direction II at opposite sides of the first slit insulating layers SD1A of the first group and the contact plugs CT. In other words, the second insulating layers SD2A of the first group are disposed opposite to each other in the second direction II with the first slit insulating layers SD1A of the first group and the contact plugs CT, which are interposed therebetween. More specifically, contact plugs CT arranged in one column along the first direction I and first slit insulating layers SD1A of the first group in two columns, which are opposite to each other with the contact plugs CT in the one column, interposed therebetween, may be disposed between the second slit insulating layers SD2A of the first group, which are arranged in the second direction II.

In an embodiment of the present disclosure, the arrangement of the contact plugs CT, the first slit insulating layers SD1A of the first group, and the second slit insulating layers SD2A may be adjusted as described above such that any one of the first slit insulating layers SD1A of the first group can be disposed between any one of the contact plugs CT and any one of the second slit insulating layers SD2A of the first group adjacent the one contact plug CT. Accordingly, in an embodiment of the present disclosure, before the second slit insulating layers SD2A of the first group are formed, sacrificial materials are removed in a state in which the second slits are exposed, so that although the pad area has an opening, material layers disposed at upper and lower portions of the pad area are supported by the first slit insulating layers SD1A of the first group, thereby reinforcing the support structure of the stacked structure of the memory block MB. Also, in an embodiment of the present disclosure, the material layers disposed at the upper and lower portions of the pad area are supported by the first slit insulating layers SD1B of the second group, thereby reinforcing the support structure of the stacked structure of the memory block MB.

The second slit insulating layers SD2A of the first group may be spaced apart from the first slit insulating layers SD1A to SD1E of the first to fifth groups.

Second slit insulating layers SD2B of the second group are disposed on the cell area CA. Each of the second slit insulating layers SD2B of the second group is disposed between a source-side channel layer S_CH and a drain-side channel layer D_CH. The second slit insulating layers SD2B of the second group extend along the first direction I, and include both ends intersecting the first slit insulating layers SD1D of the fourth group. The second slit insulating layers SD2B of the second group and the first slit insulating layers SD1D of the fourth group are connected to each other to define boundaries of the source-side stacked structure STS and the drain-side stacked structure STD.

The first slit insulating layers SD1A of the first group, the second slit insulating layers SD2A of the first group, and the first slit insulating layers SD1B of the second group are spaced apart from each other and disposed between the first slit insulating layers SD1C of the third group. Particularly, the first slit insulating layers SD1A of the first group and the first slit insulating layers SD1B of the second group are spaced apart from each other while surrounding the periphery of each of the pad areas in which the contact plugs CT are disposed so as to support the pad area. To this end, each of the first slit insulating layers SD1A of the first group and the first slit insulating layers SD1B of the second group may be formed shorter than each of the second slit insulating layers SD2A of the first group on a horizontal plane extending along the first and second directions I and II.

Referring to FIGS. 4B to 4D, the stacked structure of the memory block MB including the source-side stacked structure STS and the drain-side stacked structure STD may include a pipe gate PG disposed on the substrate SUB, and conductive patterns CP and interlayer insulating layers ILD, which are alternately disposed on the pipe gate PG.

A gate insulating layer GI may be further disposed between the pipe gate PG and the substrate SUB. The pipe gate PG may be penetrated by a pipe gate isolation layer PI to be isolated in units of stacked structures of the memory block MB. The pipe gate PG may be formed into a stacked structure of a first pipe gate PG1 and a second pipe gate PG2. The first pipe gate PG1 may include a pipe trench PT for providing a space in which a pipe channel layer P_CH is to be disposed. The second pipe gate PG2 is disposed on the first pipe gate PG1, and may be penetrated by vertical holes VH connected to the pipe trench PT.

The vertical holes VH may extend to penetrate the conductive patterns CP and the interlayer insulating layers ILD. The vertical holes VH provides a space in which the source-side channel layer S_CH and the drain-side channel layer D_CH are to be disposed. A tube-shaped string channel layer CH may be formed along the shape of inner walls of the pipe trench PT and the vertical holes VH connected thereto. A central area of the tube-shaped string channel layer CH may be filled with a core insulating layer CO. The core insulating layer CO may be formed to have a lower height than the vertical holes VH. A capping layer CAP may be further formed on the top of the core insulating layer CO. Here, the capping layer CAP is formed in an upper central area of each of the vertical holes VH and comes in contact with the tube-shaped string channel layer CH. The tube-shaped string channel layer CH may be formed of a semiconductor such as a polysilicon. The capping layer CAP may be formed of a doped semiconductor such as doped polysilicon.

The outer wall of the tube-shaped string channel layer CH may be surrounded by a tunnel insulating layer TI. The tunnel insulating layer TI may be formed of silicon oxide. The outer wall of the tunnel insulating layer TI may be surrounded by a data storage layer DS. Examples of the data storage layer DS may include a silicon nitride layer in which charges can be trapped. First blocking insulating layers BI1 may be disposed between the outer wall of the data storage layer DS and the interlayer insulating layers ILD. Examples of the first blocking insulating layers BI1 may include a silicon oxide layer. A lowermost first blocking insulating layer of the first blocking insulating layers BI1 may extend up to a space between the pipe gate PG and the data storage layer DS.

The conductive patterns CP and the interlayer insulating layers ILD, as illustrated in the section taken along line C-C', are stacked in a step structure to define an stepped edge of the stacked structure of the memory block. A contact plug CT may come in contact with each of the conductive patterns CP through the step structure. The contact plug CT is connected to any one of the conductive patterns CP and extends along the stacked direction of the conductive patterns CP. The step structure may be covered with a planarization insulating layer PD, and the contact plug CT may penetrate at least one of the planarization insulating layer PD and the interlayer insulating layers ILD.

A second blocking insulating layer BI2 may be further formed along the shape of surfaces of each of the conductive patterns CP. The second blocking insulating layer BI2 may be formed of an insulating material having a higher dielectric constant than silicon oxide. For example, the second blocking insulating layer BI2 may be formed of $Al_2O_3$. The second blocking insulating layer BI2 may be penetrated by any one of the contact plugs CT.

The conductive patterns CP and the interlayer insulating layers ILD may be penetrated by first slits SI1A to SI1C and second slits SI2A and SI2B.

The first slits may include first slits SI1A to SI1C of first to third groups and slits (not illustrated) of fourth and fifth groups. The slits of the fourth and fifth groups provide spaces in which the first slit insulating layers SD1D and SD1E of the fourth and fifth groups illustrated in FIG. 4A are disposed, and are disposed in the same layout as the first slit insulating layers SD1D and SD1E of the fourth and fifth groups.

First slit insulating layers SD1A of a first group are formed in first slits SI1A of the first group. The first slits SI1A of the first group and the first slit insulating layers SD1A of the first group penetrate the conductive patterns CP and the interlayer insulating layers ILD, and are disposed in the same layout as the first slit insulating layer SD1A of the first group, described in FIG. 4A. Particularly, the first slits SI1A of the first group or the first slit insulating layers SD1A of the first group are disposed at opposite sides of the contact plug CT. According to characteristics of a manufacturing process of the semiconductor device, the second blocking insulating layers BI2 may extend between the first slit insulating layers SD1A of the first group and the conductive patterns CP.

First slit insulating layers SD1B of a second group are formed in first slits SI1B of the second group. The first slits SI1B of the second group and the first slit insulating layers SD1B of the second group penetrate the conductive patterns CP and the interlayer insulating layers ILD, and are disposed in the same layout as the first slit insulating layer SD1B of the second group, described in FIG. 4A. Particularly, the first slits SI1B of the second group or the first slit insulating layers SD1B of the second group are disposed at opposite sides of the contact plug CT. According to characteristics of the manufacturing process of the semiconductor device, the second blocking insulating layers BI2 may extend between the first slit insulating layers SD1B of the second group and the conductive patterns CP.

First slit insulating layers SD1C of a third group are formed in first slits SI1C of the third group. The first slits SI1C of the third group and the first slit insulating layers SD1C of the third group penetrate the conductive patterns CP and the interlayer insulating layers ILD, thereby isolating the conductive patterns CP and the interlayer insulating layers ILD in units of the stacked structures of the memory block MB. The first slits SI1C of the third group and the first slit insulating layers SD1C of the third group are disposed in the same layout as the first slit insulating layer SD1C of the third group illustrated in FIG. 4A. The first slits SI1C of the third group or the first slit insulating layers SD1C of the third group may be overlapped with each other on the pipe gate isolation layer PI. The first slit insulating layers SD1C of the third group may extend to come in contact with the pipe gate isolation layer PI. According to characteristics of the manufacturing process of the semiconductor device, the second blocking insulating layers BI2 may extend between the first slit insulating layers SD1C of the third group and the conductive patterns C P.

Although not illustrated, according to characteristics of the manufacturing process of the semiconductor device, the second blocking insulating layers BI2 may extend between the first slit insulating layers of the fourth group and the conductive patterns CP. Also, the second blocking insulating layers BI2 may extend between the first slit insulating layers of the fifth group and the conductive patterns CP.

The first slit insulating layers SD1A to SD1E of the first to fifth groups are simultaneously formed by etching the same material layers, and therefore may be formed to have the same depth. The first slit insulating layers SD1A to SD1E of the first to fifth groups may extend to penetrate at least one portion of the second pipe gate PG2.

The second slits SI2A and SI2B may be used as paths through which a sacrificial material is removed so as to open a conductive pattern area in which the conductive patterns CP are disposed. Alternatively, second slits SI2A and SI2B may be used as paths through which the conductive pattern area is filled with a conductive material. The second slits SI2A and SI2B may be disposed with a density where the sacrificial material is easily removed. The second slits may include second slits SI2A of a first group, disposed on the first and second contact areas CTA1 and CTA2, and second slits SI2B of a second group, disposed on the cell area CA.

The second slit insulating layers SD2A of the first group are formed in the second slits SI2A of the first group. The second slits SI2A of the first group and the second slit insulating layers SD2A of the first group penetrate the conductive patterns CP and the interlayer insulating layers ILD, and are disposed in the same layout as the second slit insulating layers SD2A of the first group illustrated in FIG. 4A. Particularly, the second slits SI2A of the first group or the second slit insulating layers SD2A of the first group may be disposed at opposite sides of at least one pair of first slit insulating layers SD1B of the first group. Here, the at least one pair of first slit insulating layers SD1B of the first group are formed in a sandwich structure with the contact plug CT interposed therebetween.

The second slit insulating layers SD2B of the second group are formed in the second slits SI2B of the second group. Each of the second slits SI2B of the second group or the second slit insulating layers SD2B of the second group may be disposed between the vertical holes VH. In other words, each of the second slits SI2B of the second group or the second slit insulating layers SD2B of the second group may be disposed between the source-side channel layer S_CH and the drain-side channel layer D_CH.

The second slit insulating layers SD2A and SD2B of the first and second groups are simultaneously formed by etching the same material layer, and therefore may be formed with the same depth. The second slit insulating layers SD2A and SD2B of the first and second groups are formed through a process performed separately from a process of forming the first slit insulating layers SD1A to SD1E of the first to fifth groups, and therefore may be formed with a different depth from the first slit insulating layers SD1A to SD1E of the first to fifth groups. For example, the second slit insulating layers SD2A and SD2B of the first and second groups may extend up to the same position as the top surface of the second pipe gate PG2 or extend to a higher position to the top surface of the second pipe gate PG2.

In an embodiment, the second blocking insulating layers BI2 may be formed in shapes that have open sidewalls of the conductive patterns CP facing the second slit insulating layers SD2A and SD2B of the first and second groups. Accordingly, the second slit insulating layers SD2A and SD2B of the first and second groups may come in contact with the sidewalls of the conductive patterns CP.

FIGS. 5A to 11C are diagrams illustrating examples of a manufacturing method of a semiconductor device according to an embodiment of the present disclosure.

Figure 5B:
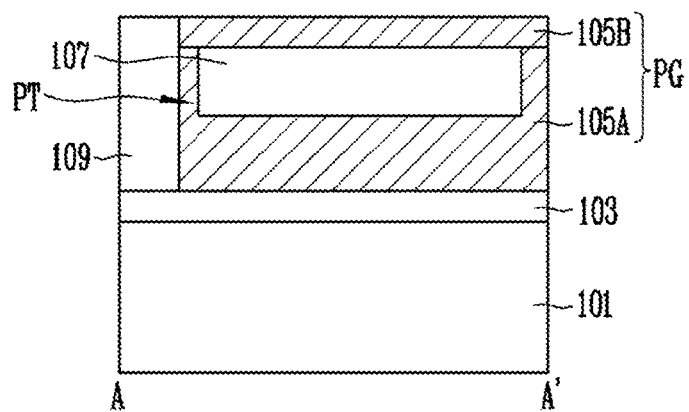
FIGS. 5A to 11C are diagrams illustrating examples of a manufacturing method of a semiconductor device according to an embodiment of the present disclosure.

FIGS. 5A and 5B are plan and sectional views illustrating an example of a method of forming a pipe gate having a sacrificial material embedded therein. FIG. 5B is a sectional view taken along line A-A' shown in FIG. 5A.

Referring to FIGS. 5A and 5B, a pipe gate PG is formed on a substrate 101 including a cell area CA and first and second contact areas CTA1 and CTA2. The first and second contact areas CTA1 and CTA2 are disposed at opposite sides of the cell area CA, and may extend along the first direction I.

The pipe gate PG may be formed on a gate insulating layer 103 disposed on the substrate 101.

The pipe gate PG may be formed in a stacked structure of first and second pipe gates 105A and 105B. The first and second pipe gates 105A and 105B may be formed of a conductive material. For example, the first and second pipe gates 105A and 105B may be formed as silicon layers. The pipe gate PG may be isolated in units of memory blocks by a pipe gate isolation insulating layer PI.

Pipe trenches PT filled with a sacrificial material are formed inside the first pipe gate 105A, and the first pipe gate 105A including the sacrificial material is covered by the second pipe gate 105B.

The pipe gate isolation insulating layer PI may come in contact with the gate insulating layer 103 by penetrating the first and second pipe gates 105A and 105B. The sacrificial material 107 may include TiN.

In order to form the above-described structure, the gate insulating layer 103 is first formed on the substrate 101. After that, the first pipe gate 105A is formed on the gate insulating layer 103, and the pipe trenches PT are then formed by etching the first pipe gate 105A. The pipe trenches PT are disposed on the cell area CA, and may be arranged in a matrix form. After that, the sacrificial material 107 is formed in the pipe trenches PT, and then the second pipe gate 105B is formed on the first pipe gate 105A including the sacrificial material 107.

Subsequently, a pipe gate slit is formed by etching the first and second pipe gates 105A and 105B. Here, the pipe gate slit penetrates the first and second pipe gates 105A and 105B, and divides the first and second pipe gates 105A and 105B into the pipe gate PG in units of memory blocks. Subsequently, the pipe gate isolation insulating layer PI is formed in the pipe gate slit.

Figure 6A:
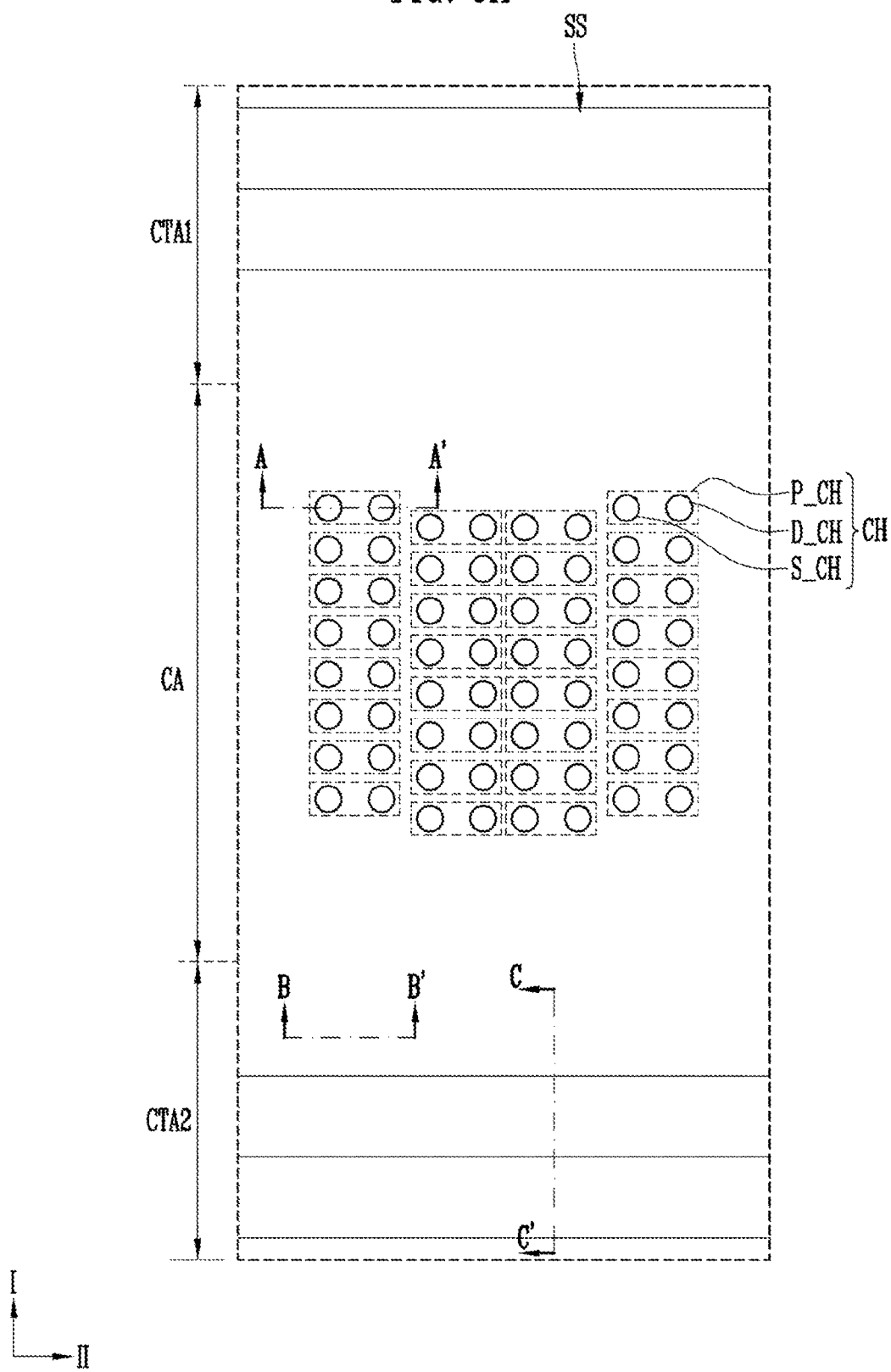
Figure 6C:
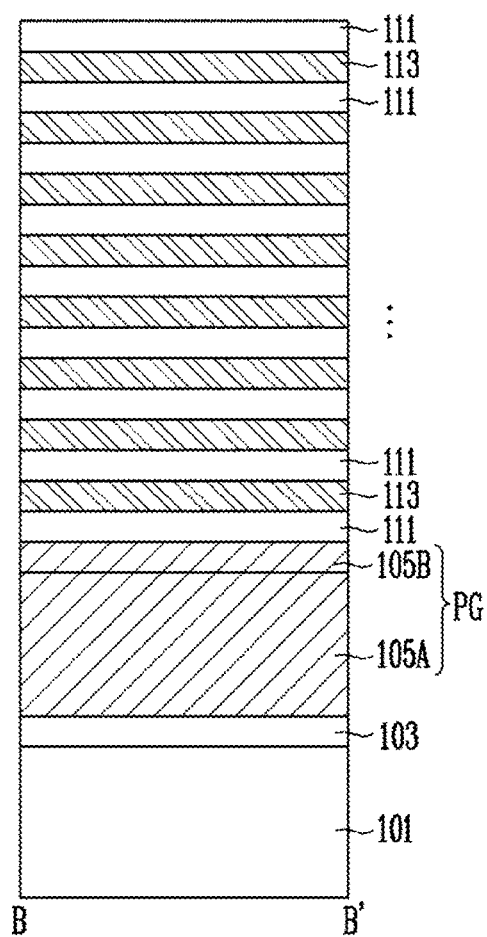

FIGS. 6A to 6D are plan and sectional views illustrating examples of a process of forming a step structure penetrated by a string channel layer. More specifically, FIG. 6A is a plan view of an example of the step structure penetrated by the string channel layer, and FIGS. 6B to 6D are sectional views taken along lines A-A', B-B', and C-C' shown in FIG. 6A, respectively.

Referring to FIGS. 6A to 6D, first material layers 111 and second material layers 113 are alternately stacked on the pipe gate PG, which have the sacrificial material embedded therein and is separated by the pipe gate isolation insulating layer PI. The first material layers 111 may be formed in areas in which interlayer insulating layers are to be disposed, and the second material layers 113 may be formed in areas in which conductive patterns are to be disposed.

The second material layers 113 are formed of a different material from the first material layers 111. For example, the first material layers 111 may be formed of an insulating material for interlayer insulating layers, and the second material layers 113 may be formed of a sacrificial insulating material that is used as a sacrificial material and has an etching selection ratio with respect to the first material layers 111. In this case, the first material layers 111 may be formed of silicon oxide, and the second material layers 113 may be formed of silicon nitride. When both the first and second material layers 111 and 113 are formed of an insulating material, it is possible to decrease the degree of difficulty of etching processes for forming vertical holes or slits.

Alternatively, the first material layers 111 may be formed of a sacrificial conductive material that is used as a sacrificial material and has an etching selection ratio with respect to the second material layers 113, and the second material layers 113 may be formed of a conductive material for conductive patterns. In this case, the first material layers 111 may be formed of undoped polysilicon, and the second material layers 113 may be formed of doped polysilicon. When both the first and second material layers 111 and 113 are formed of polysilicon, it is possible to decrease the degree of difficulty of etching processes for forming vertical holes or slits.

Hereinafter, the first material layers 111, which are formed of an insulating material and used as interlayer insulating layers, and the second material layers 113, which are formed of a sacrificial insulating material, are provided as an example only and not intended to limit the present disclosure.

Subsequently, vertical holes VH are formed by etching the first material layers 111 and the second material layers 113.

The vertical holes VH are connected to the pipe trench PT by further penetrating the second pipe gate 105B. At least one pair of vertical holes VH may be connected to the pipe trench PT. The sacrificial material in the pipe trench PT is removed through the vertical holes VH, thereby opening the pipe trench PT.

After that, a first blocking insulating layer 115, a data storage layer 117, a tunnel insulating layer 119, and a string channel layer CH are sequentially formed on inner walls of the pipe trench PT and the vertical holes VH. Each of the first blocking insulating layer 115, the data storage layer 117, the tunnel insulating layer 119, and the string channel layer CH may be formed in a tubular shape in which central areas of the pipe trench PT and the vertical holes VH are opened. The tunnel insulating layer 115 may be formed of silicon oxide, the data storage layer 117 may be formed of silicon nitride, and the first blocking insulating layer 119 may be formed of silicon oxide. The string channel layer CH may include a pipe channel layer P_CH, a drain-side channel layer D_CH, and a source-side channel layer S_CH. The pipe channel layer P_CH is disposed inside the pipe trench PT, the drain-side channel layer D_CH is disposed inside a drain-side hole out of the vertical holes VH, and the source-side channel layer S_CH is disposed inside a source-side hole out of the vertical holes VH.

A central area of the string channel layer CH may be filled with a core insulating layer CO. Both ends of the core insulating layer CO, which is disposed inside the vertical holes VH, may be partially etched. In this case, both the ends of the core insulating layer CO may be formed to have a lower height than both ends of the string channel layer CH. A top end of each of the vertical holes VH may be opened by the core insulating layer CO of which height is lowered. The top end of each of the vertical holes VH opened by the core insulating layer CO of which height is lowered may be filled with a capping layer CAP. The capping layer CAP comes in contact with the string channel layer CH, and may be formed of doped silicon. The capping layers CAP may be used as junction regions.

Subsequently, the first material layers 111 and the second material layers 113 are etched to form a step structure SS on the first and second contact areas CTA1 and CTA2. Accordingly, the first and second material layers 111 and 113 penetrated by the string channel layer CH are patterned into the step structure SS.

The step structure SS is disposed on the first and second contact areas CTA1 and CTA2, and defined by the first and second material layers 111 and 113 patterned to protrude toward the first and second contact areas CTA1 and CTA2 as they come closer to the substrate 101.

After that, a planarization insulating layer PD covering the step structure SS is formed.

Figure 7A:
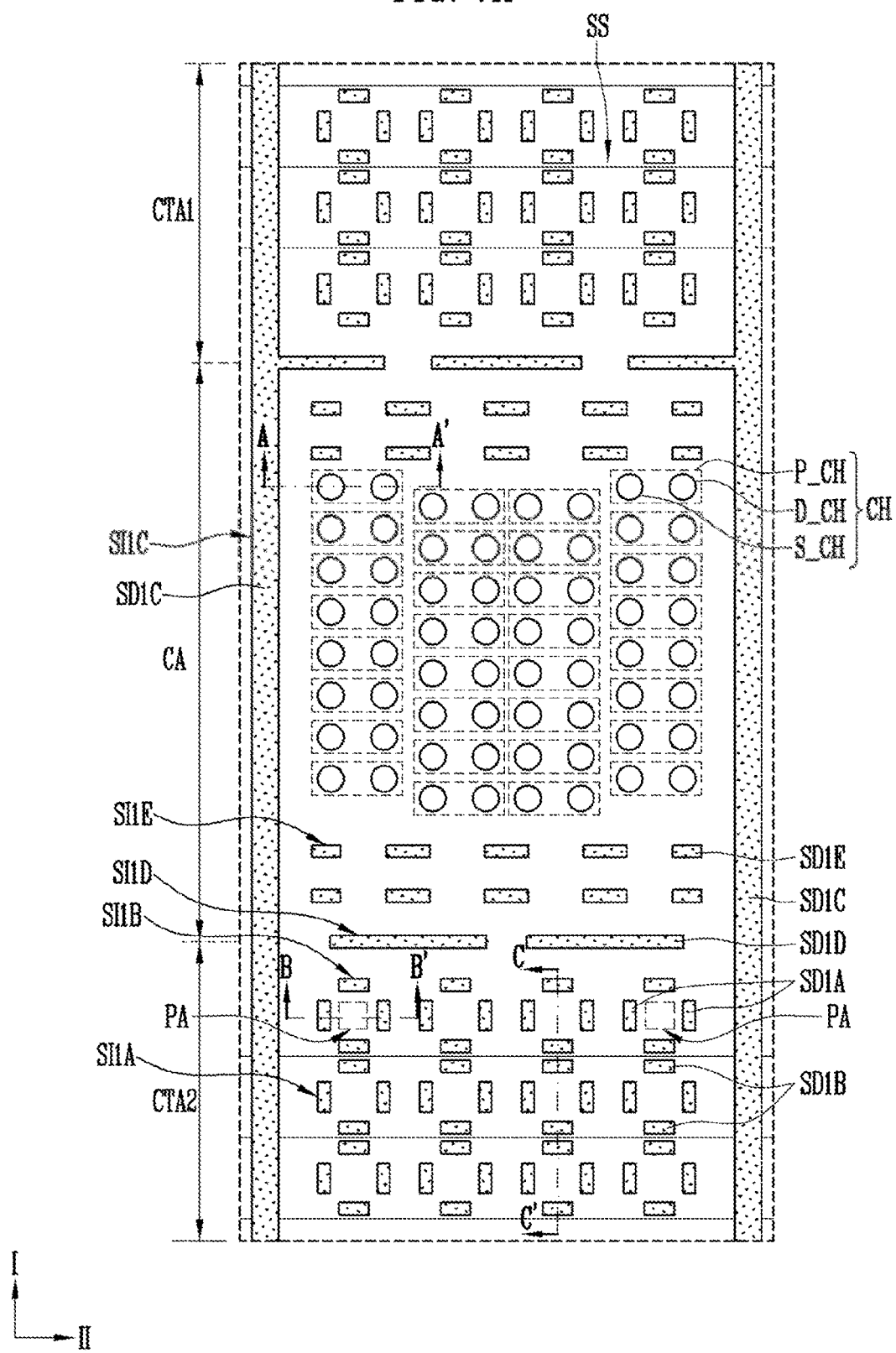
Figure 7D:
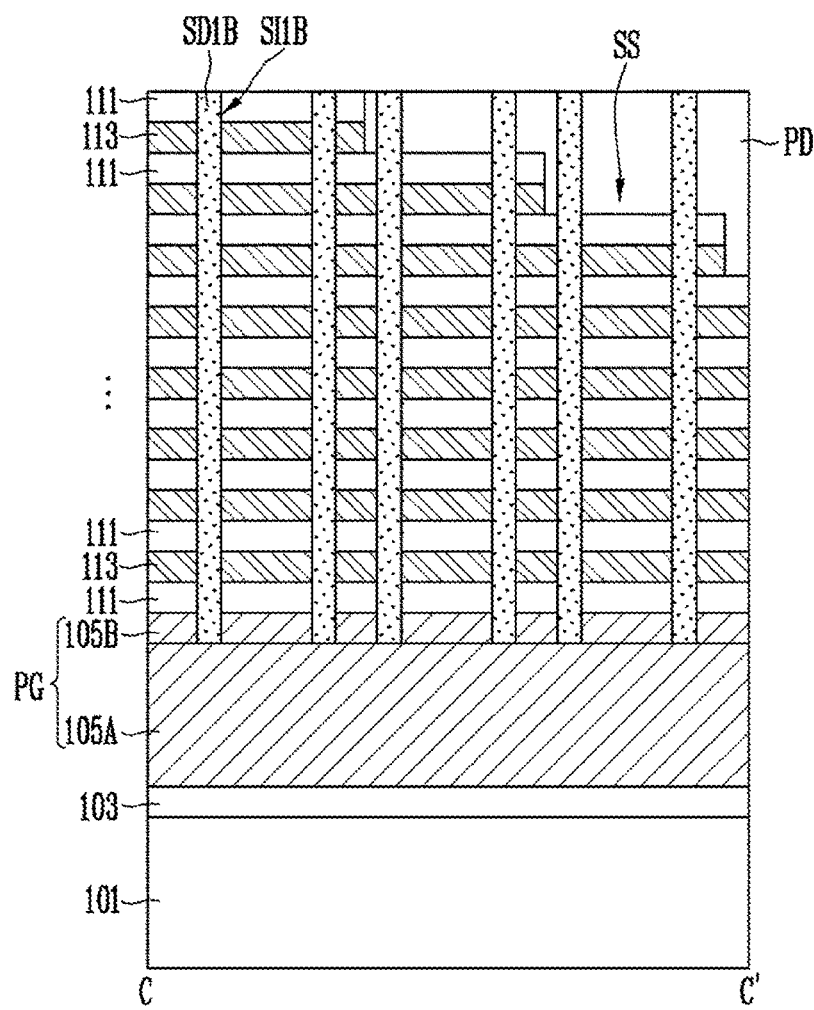

FIGS. 7A to 7D are plan and sectional views illustrating examples of a process of forming first slits and first slit insulating layers. More specifically, FIG. 7A is a plan view illustrating an example layout of the first slits and the first slit insulating layers, and FIGS. 7B to 7D are sectional views taken along lines A-A', B-B', and C-C' shown in FIG. 7A, respectively.

Referring to FIGS. 7A to 7D, the planarization insulating layer PD, the first material layers 111, and the second material layers 113 are etched, thereby forming first slits SI1A and SI1E penetrating them. The first slits SI1A to SI1E may further penetrate the second pipe gate 105B. After that, an insulating material is formed in the first slits SI1A to SI1E, thereby forming first slit insulating layers SD1A to SD1E.

The first slits SI1A to SI1E and the first slit insulating layers SD1A to SD1E may be divided into first to fifth groups.

First slits SI1A of the first group and first slit insulating layers SD1A of the first group, which are formed in the first slit SI1A of the first group, are disposed on the first and second contact areas CTA1 and CTA2. The first slits SI1A of the first group or the first slit insulating layers SD1A of the first group are disposed opposite to each other in the second direction II with any one among pad areas PA defined at each step of the step structure SS, which is interposed therebetween. The first slits SI1A of the first group or the first slit insulating layers SD1A of the first group are spaced apart from each other.

First slits SI1B of the second group and first slit insulating layers SD1B of the second group, which are formed in the first slits SI1B of the second group, are disposed on the first and second contact areas CTA1 and CTA2. The first slits SI1B of the second group or the first slit insulating layers SD1B of the second group are disposed in the first direction I at opposite sides of any one among the pad areas PA defined at each step of the step structure SS. The first slits SI1B of the second group or the first slit insulating layers SD1B of the second group are spaced apart from each other. The first slits SI1B of the second group and the first slit insulating layers SD1B of the second group are spaced apart from the first slits SI1A of the first group and the first slit insulating layers SD1A of the first group.

First slits SI1C of the third group and first slit insulating layers SD1C of the third group, which are formed in the first slits SI1C of the third group, isolate the first material layers 111 and the second material layers 113 in units of memory blocks. The first slits SI1C of the third group and first slit insulating layers SD1C of the third group may be connected to the pipe gate isolation insulating layer PI on the pipe gate isolation insulating layer PI.

First slits SI1D of the fourth group or first slit insulating layers SD1D of the fourth group, which are formed in the first slits SI1D of the fourth group, are disposed on a boundary between the cell area CA and the first contact area CTA1 and a boundary between the cell area CA and the second contact area CTA2, and are spaced apart from each other. The first slits SI1D of the fourth group or first slit insulating layers SD1D of the fourth group may include first contact area-side patterns and second contact area-side patterns. The first contact area-side patterns are arranged in a line along the second direction II, and their edge patterns may be connected to the first slits SI1C of the third group and the first slit insulating layers SD1C of the third group. The second contact area-side patterns are arrange in a line along the second direction II, and their edge patterns may be spaced apart from the first slits SI1C of the third group and the first slit insulating layers SD1C of the third group. The first contact area-side patterns may be arranged in zigzag fashion with the second contact area-side patterns.

First slits SI1E of the fifth group or first slit insulating layers SD1E of the fifth group, which are filled therein, are disposed at edges of the cell area CA, adjacent to the first and second contact areas CTA1 and CTA2, and spaced apart from each other.

The above-described first slit insulating layers SD1A to SD1E may serve as supports in a subsequent process.

Figure 8A:
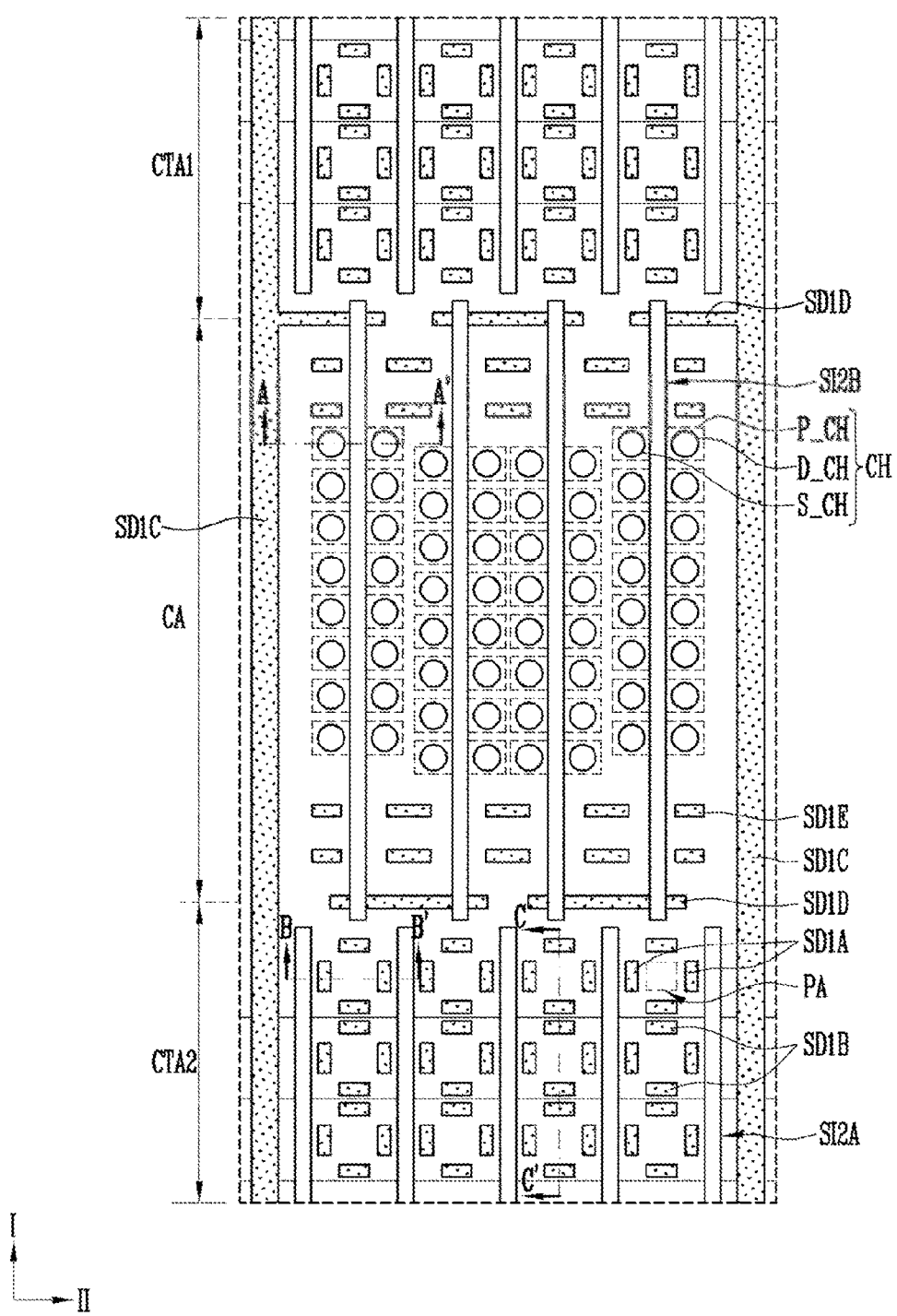
Figure 8B:
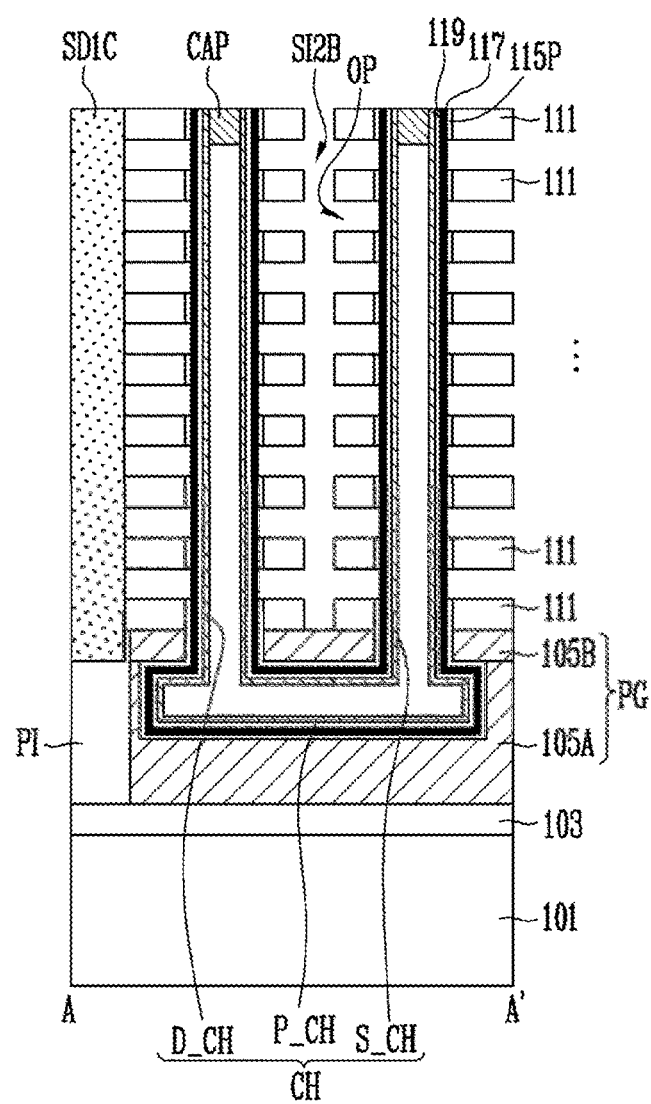
Figure 8C:
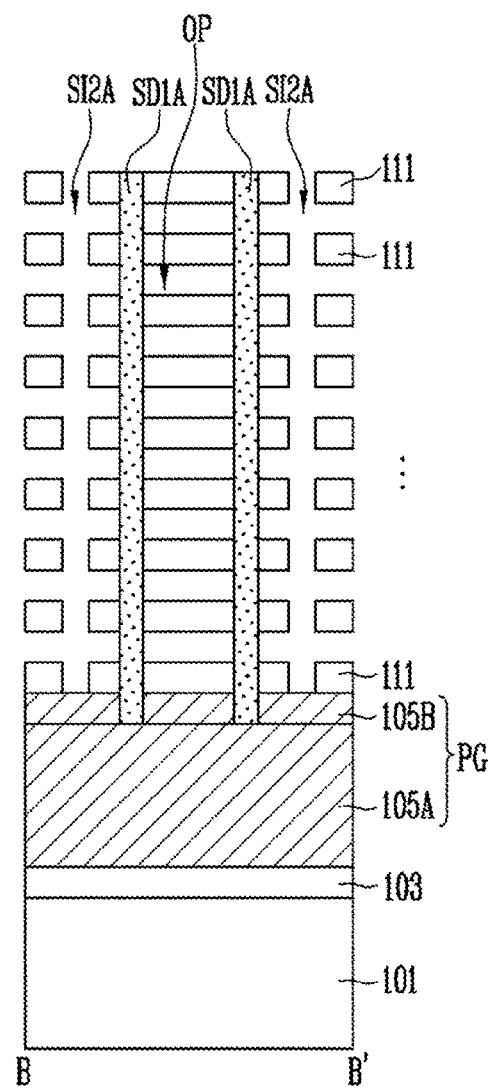

FIGS. 8A to 8C are plan and sectional views illustrating a process of forming second slits. More specifically, FIG. 8A is a plan view illustrating a layout of the second slits, and FIGS. 8B and 8C are sectional views taken along lines A-A', and B-B' shown in FIG. 8A, respectively.

Referring to FIGS. 8A to 8C, the planarization insulating layer (PD of FIG. 7D), the first material layers 111, and the second material layers 113 are etched, thereby forming second slits SI2A and SI2B penetrating them. The second slits SI2A and SI2B extend along the first direction I that is a direction in which the first slit insulating layers SD1C of the third group extend. The second slits SI2A and SI2B may be used as paths through which an etching material comes into the structure in a process of selectively removing the first material layers 111 or the second material layers 113. The second slits SI2A and SI2B may be spaced apart from each other to an extent enough to easily remove the first material layers 111 or the second material layers 113. The second slits SI2A and SI2B may be formed to have a different depth from the first slit insulating layers SD1A to SD1E. The second slits SI2A and SI2B may be divided into first and second groups.

Second slits SI2A of the first group are disposed in each of the first and second contact areas CTA1 and CTA2 may be spaced apart from each other. The second slits SI2A of the first group are disposed in each of the first and second contact areas CTA1 and CTA2 may be spaced apart from each other in the second direction II. The second slits SI2A of the first group are spaced apart from the first slit insulating layers SD1D of the fourth group. Therefore, the first material layers 111 and the second material layers 113 are not isolated to form patterns disposed in the cell area CA and the first and second contact areas CTA1 and CTA2. In other words, the first material layers 111 and the second material layers 113 may remain as patterns extending from the cell area CA to the first contact area CTA1 or remain as patterns extending from the cell area CA to the second contact area CTA2.

In order to firmly support the structures formed in the pad areas PA, a layout of the second slits SI2A of the first group is designed such that pad areas PA, which are arranged in one column, and first slit insulating layers SD1A of the first group, which are arranged in two columns at opposite sides of the pad areas PA, are disposed between adjacent second slits SI2A of the first group. Therefore, at least one first slit insulating layer SD1A of the first group may be disposed between each of the pad areas PA and a second slit SI2A of the first group adjacent thereto. Accordingly, even if the pad areas PA has an opening between the first material layers 111 in the process of removing the second material layers 113 through the second slits SI2A of the first group, the pad areas PA may be firmly supported by the first slit insulating layers SD1A of the first group. Also, four sides around each of the pad areas PA are supported by a pair of first slit insulating layers SD1A of the first group and a pair of first slit insulating layers SD1B of the second group, so that the pad areas PA may be firmly supported.

Second slits SI2B of the second group are spaced apart from each other in the cell area CA. Each of the second slits SI2B of the second group may be disposed between the drain-side channel layer D_CH and the source-side channel layer S_CH adjacent to each other. One end of each of the second slits SI2B of the second group may be connected to any one of first contact area-side first slit insulating layers SD1D of the fourth group, and the other end of each of the second slits SI2B of the second group may be connected to any one of second contact area-side first slit insulating layers SD1D of the fourth group. Accordingly, the first material layers 111 and the second material layers 113 may be divided into a source-side pattern surrounding the source-side channel layer S_CH and a drain-side pattern surrounding the drain-side channel layer D_CH.

After that, the second material layer 113 exposed through the second slits SI2A and SI2B are selectively removed. Accordingly, openings OP are formed between the first material layers 111. The first blocking insulating layer (115 of FIG. 7B) may be further etched through the openings OP, thereby exposing the data storage layer 117. The first blocking insulating layer may be divided into a plurality of first blocking insulating patterns 115P by the openings OP. Also, sidewalls of the first slit insulating layers SD1A to SD1E may be exposed by the openings OP.

In the above-described process of forming the openings OP, the first slit insulating layers SD1A to SD1E may support the first material layers 111 such that the gap between the first material layers 111 (i.e., the height of each of the openings OP) can be maintained. Particularly, in an embodiment of the present disclosure, the four sides of each of the pad areas in which contact plugs are to be disposed in a subsequent process are supported by the first slit insulating layers SD1A of the first group and the first slit insulating layers SD1B of the second group, and thus the first material layers 111 around the pad area PA can be firmly supported.

Figure 9A:
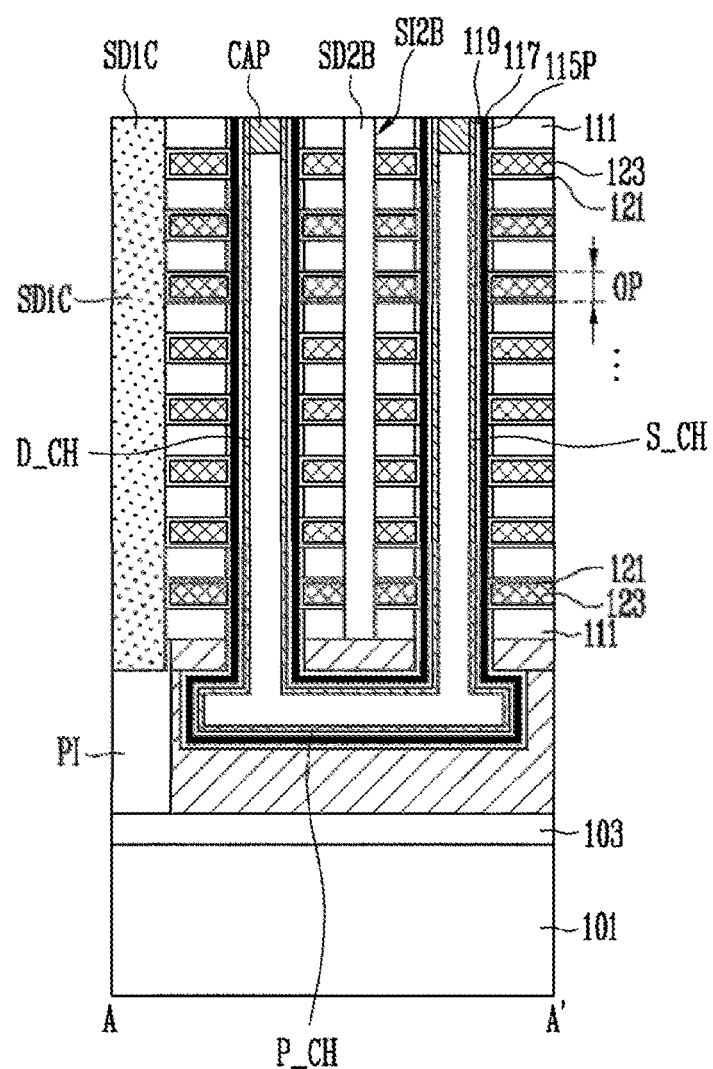
Figure 9B:
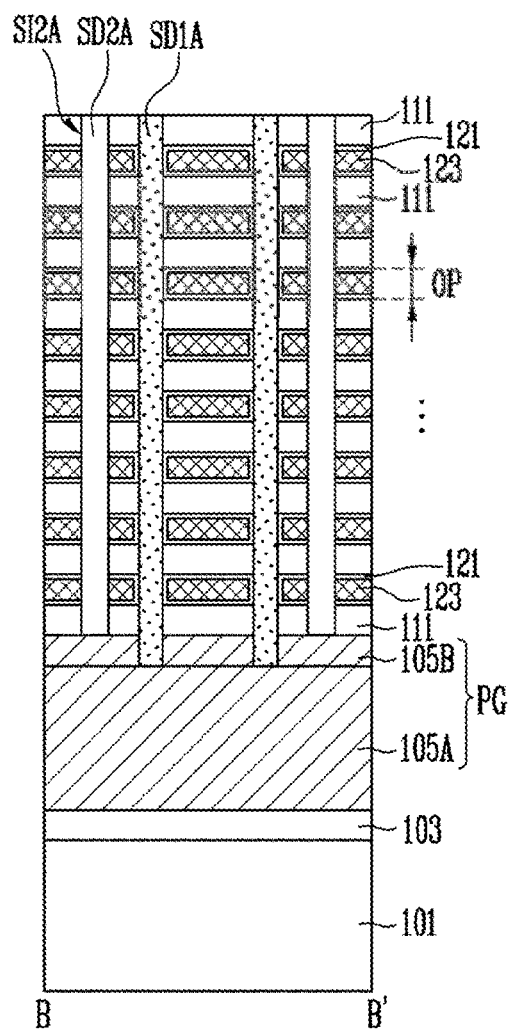
Figure 9C:
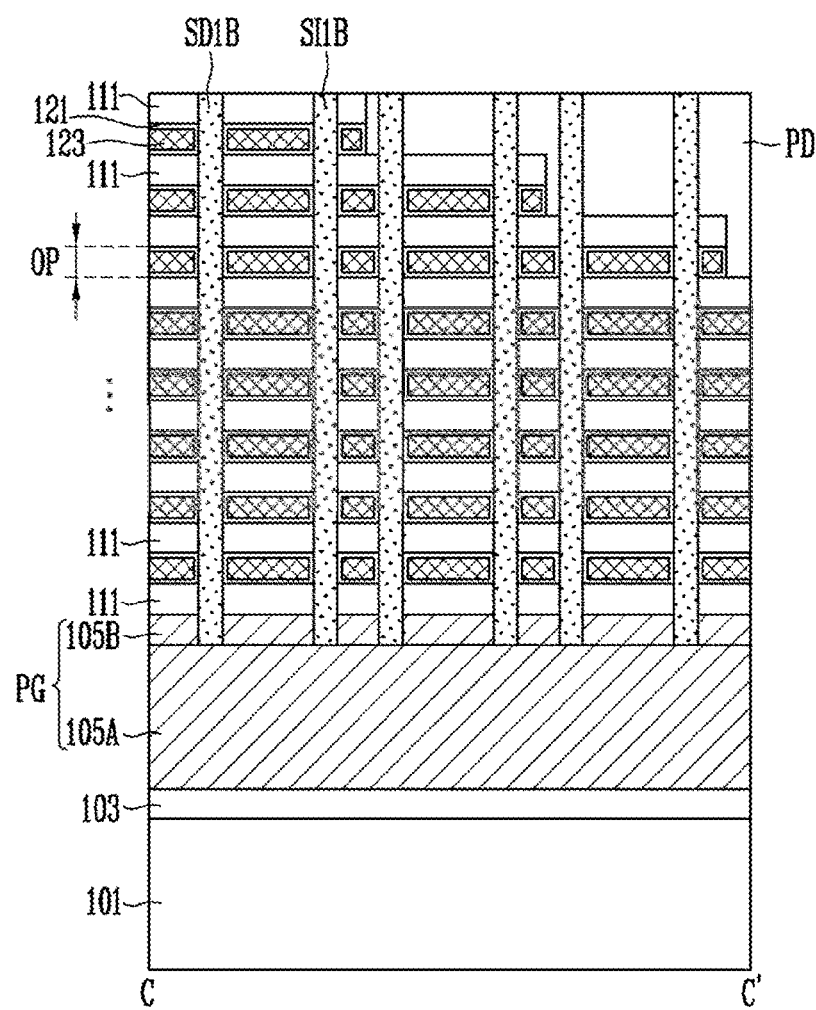

FIGS. 9A to 9C are sectional views illustrating an example of a process of forming third material layers and second slit insulating layers. More specifically, the sectional views shown in FIGS. 9A to 9C are taken along the same lines as lines A-A', B-B', and C-C' shown in FIG. 4A, respectively.

Referring to FIGS. 9A to 9C, a second blocking insulating layer 121 may be formed along surfaces of the openings OP. The second blocking insulating layer 121 may be formed of a material having a higher dielectric constant than the first block insulating patterns 115P. For example, the second blocking insulating layer 121 may be formed of $Al_2O_3$.

Subsequently, third material layers 123 may be formed in the openings OP on the second blocking insulating layer 121. The third material layers 123 may be conductive materials used as conductive patterns. The third material layers 123 may be isolated by the second slits SI2A and SI2B.

After that, second slit insulating layers SD2A and SD2B are formed in the second slits SI2A and SI2B, respectively. Like the second slits SI2A and SI2B, the second slit insulating layers SD2A and SD2B may be isolated into first and second groups. The second slit insulating layers SD2A and SD2B may be formed to come in contact with sidewalls of the third material layers 123.

Figure 10A:
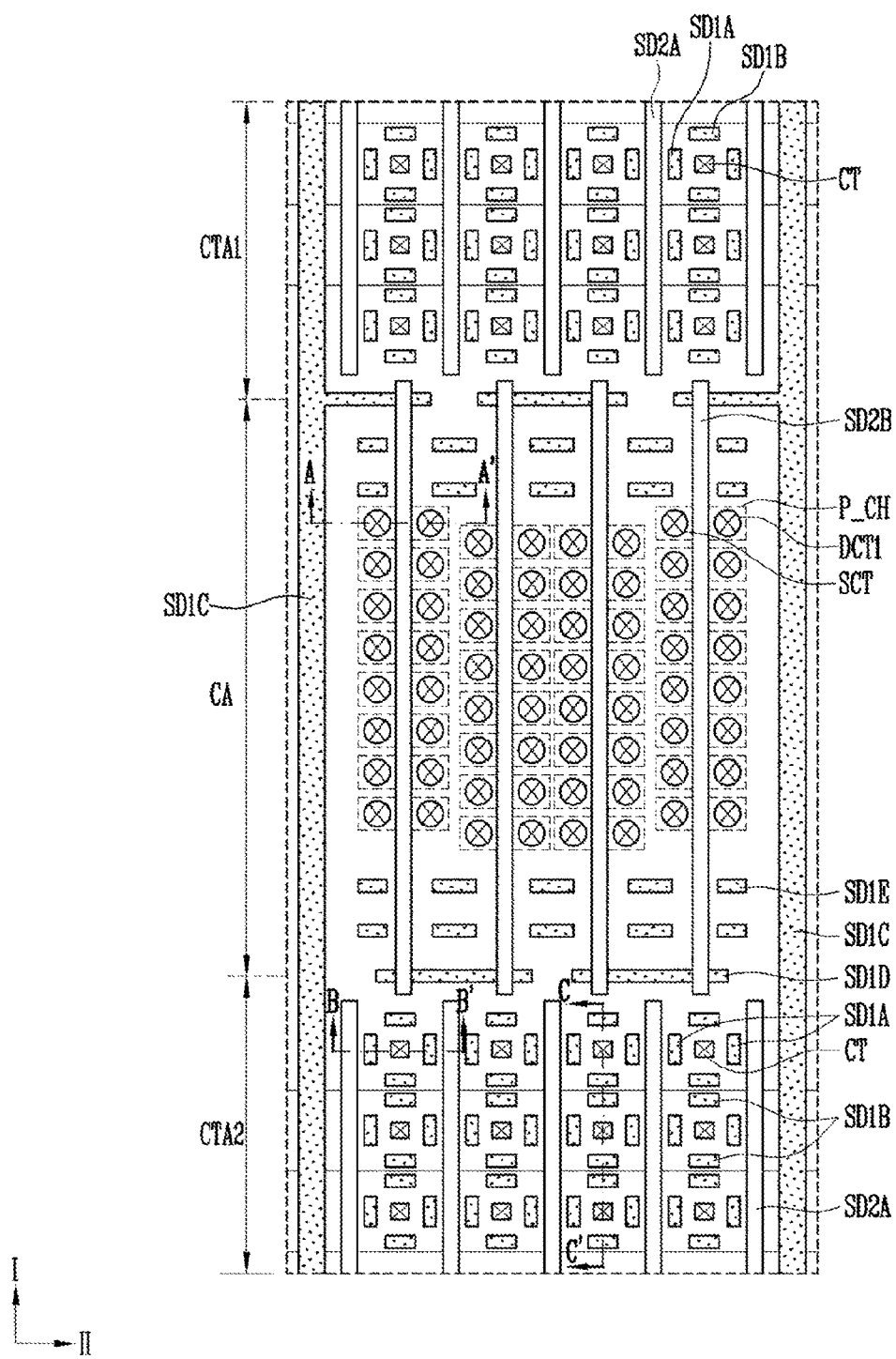
Figure 10B:
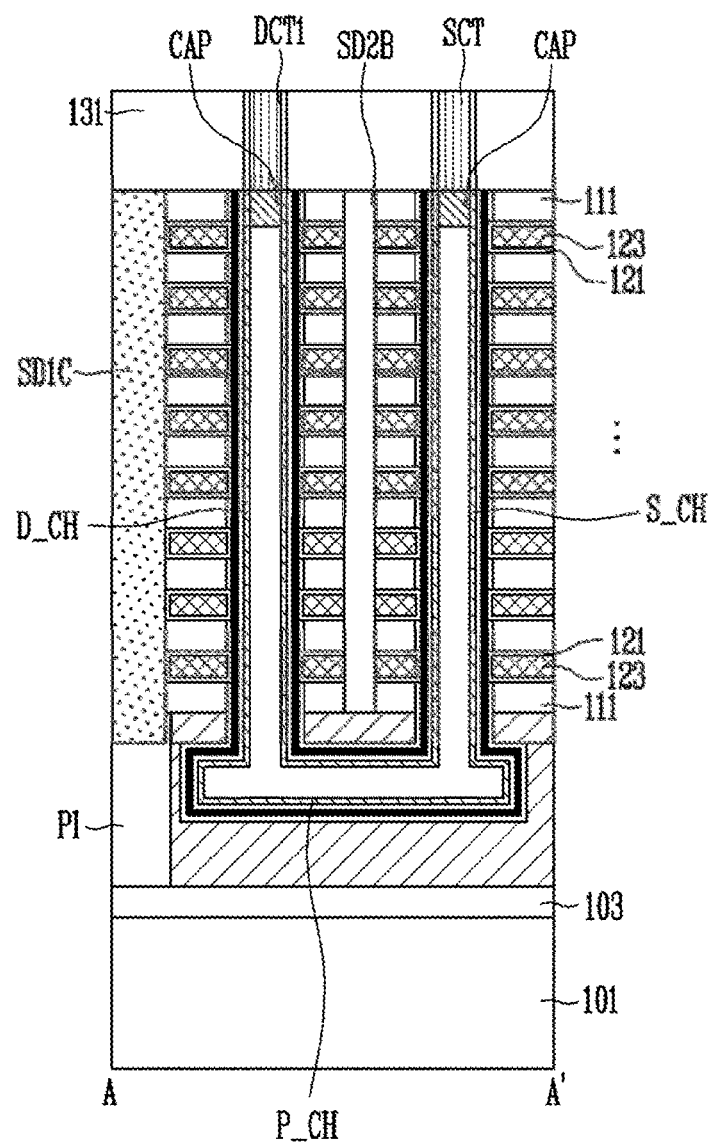
Figure 10C:
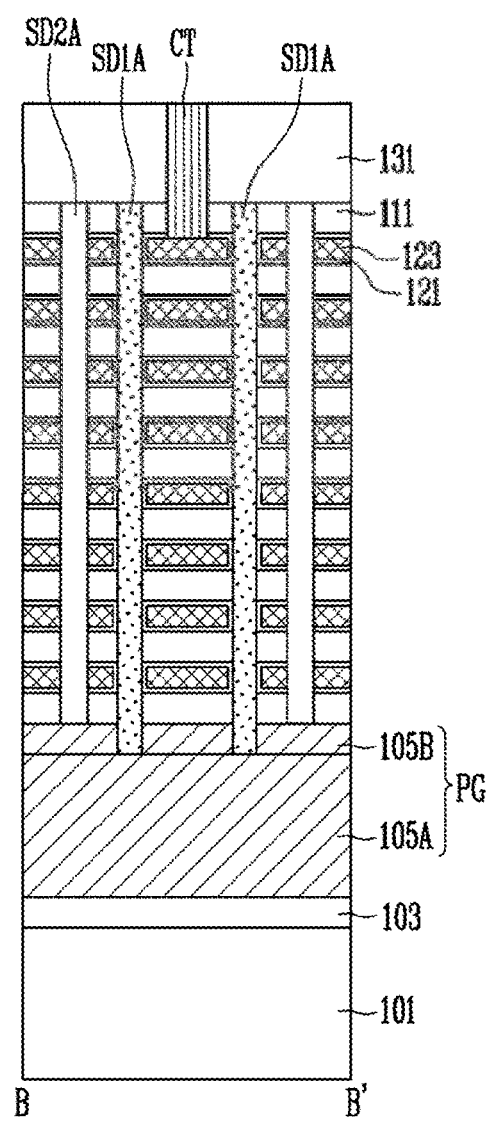
Figure 10D:
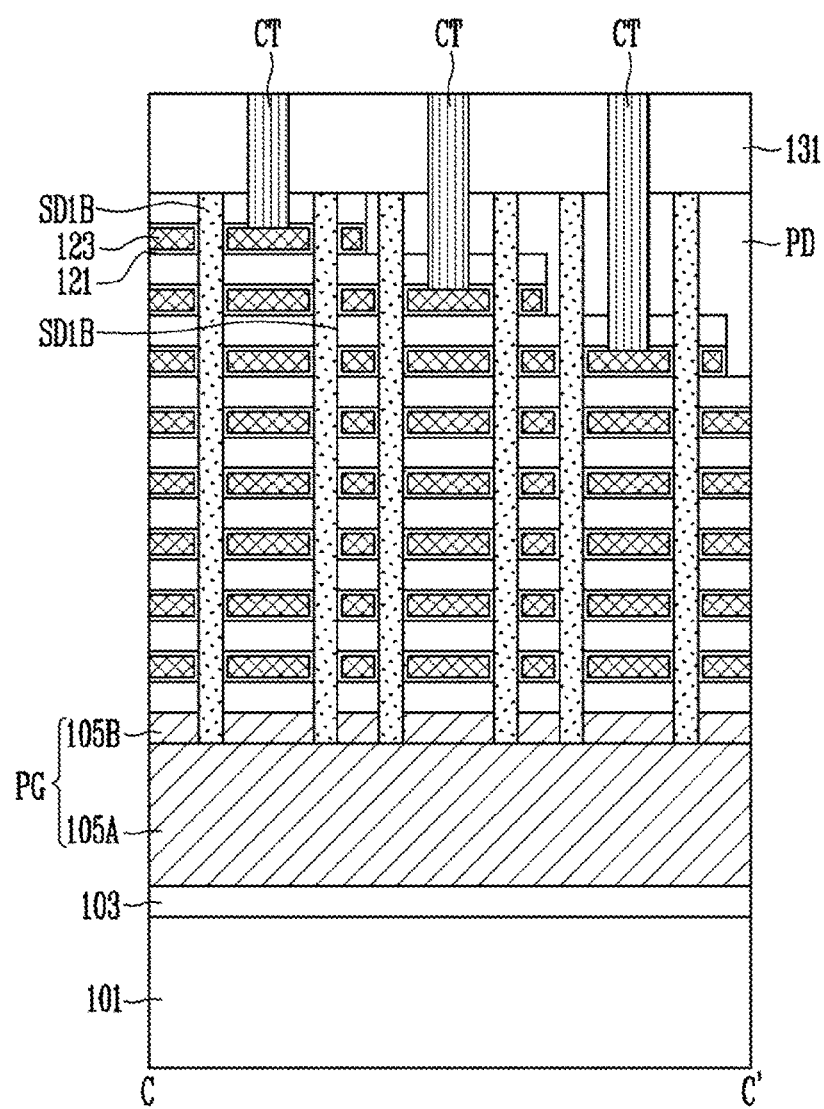

FIGS. 10A to 10D are plan and sectional views illustrating an example of a process of forming conductive plugs of a first group. More specifically, FIG. 10A is a plan view illustrating a layout of the conductive plugs of the first group, and FIGS. 10B to 10D are sectional views taken along lines A-A', B-B', and C-C' shown in FIG. 10A, respectively.

Referring to FIGS. 10A to 10D, a first upper insulating layer 131 may be formed on the first material layers 111 and the third material layers 123, which are penetrated by the first slit insulating layers SD1A to SD1E and the second slit insulating layers SD2A and SD2B, and alternately stacked. The first upper insulating layer 131 may extend to the top of the planarization insulating layer PD.

Subsequently, at least one of the planarization insulating layer PD, the first upper insulating layer 131, and the first material layers 111 are etched, thereby forming capping layers CAP surrounded by the drain-side channel layer D_CH and the source-side channel layer S_CH and contact holes of a first group, which expose the third material layers 123 forming a step structure in the first and second contact areas CTA1 and CTA2.

After that, the contact holes of the first group are filled with a conductive material, thereby forming conductive plugs DCT1, SCT, and CT of a first group. The conductive plugs DCT1, SCT, and CT of the first group may include a first drain contact plug DCT1, a source contact plug SCT, and cell contact plugs CT. The first drain contact plug DCT1 comes in contact with the capping layer CP surrounded by the drain-side channel layer D_CH and comes in contact with the capping layer CAP surrounded by the source-side channel layer S_CH. The cell contact plugs CT respectively come in contact with the third material layers 123 forming the step structure in the first and second contact areas CTA1 and CTA2.

The cell contact plugs CT may further penetrate the second block insulating layers 121 formed along the surfaces of the third material layers 123. Each of the cell contact plugs CT is disposed between the first slit insulating layers SD1A of the first group disposed adjacent to each other. Each of the cell contact plugs CT is disposed between the first slit insulating layers SD1B of the second group disposed adjacent to each other. In other words, each of the cell contact plug CT may be surrounded by a pair of first slit insulating layers SD1A of the first group, which are opposite to each other, and a pair of first slit insulating layers SD1B of the second group, which are opposite to each other.

Figure 11A:
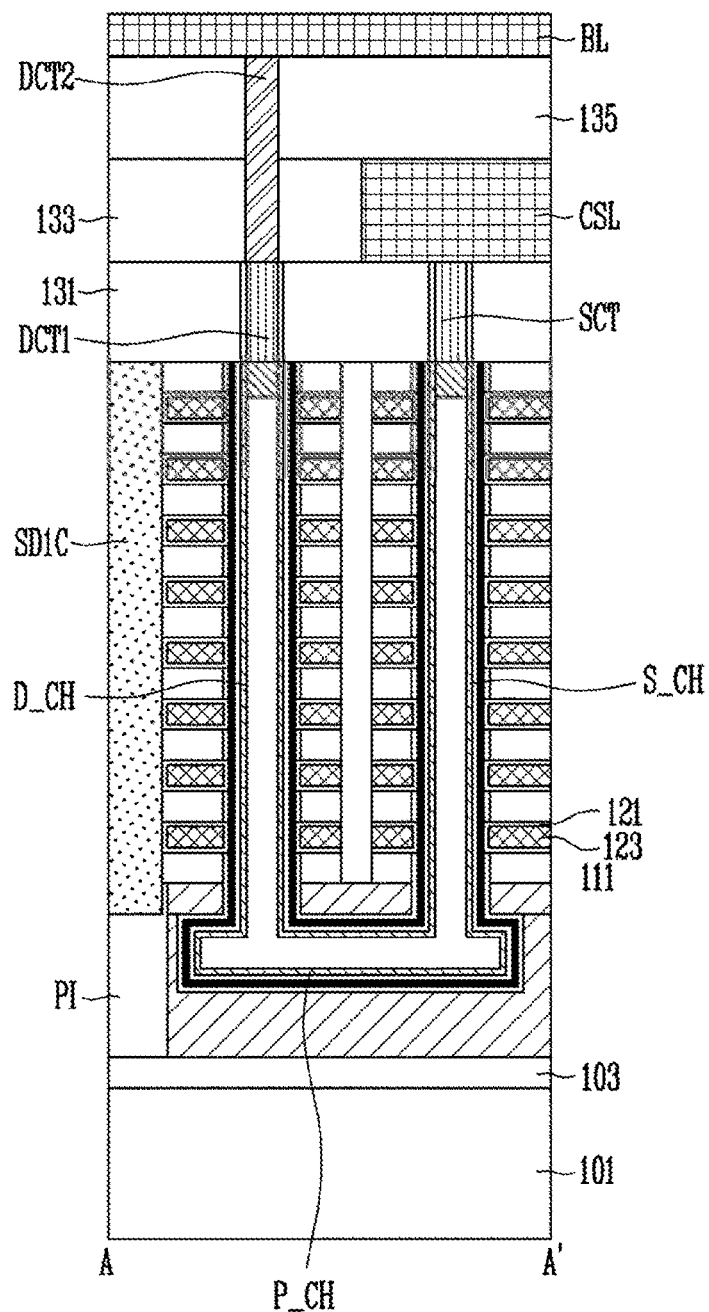
Figure 11B:
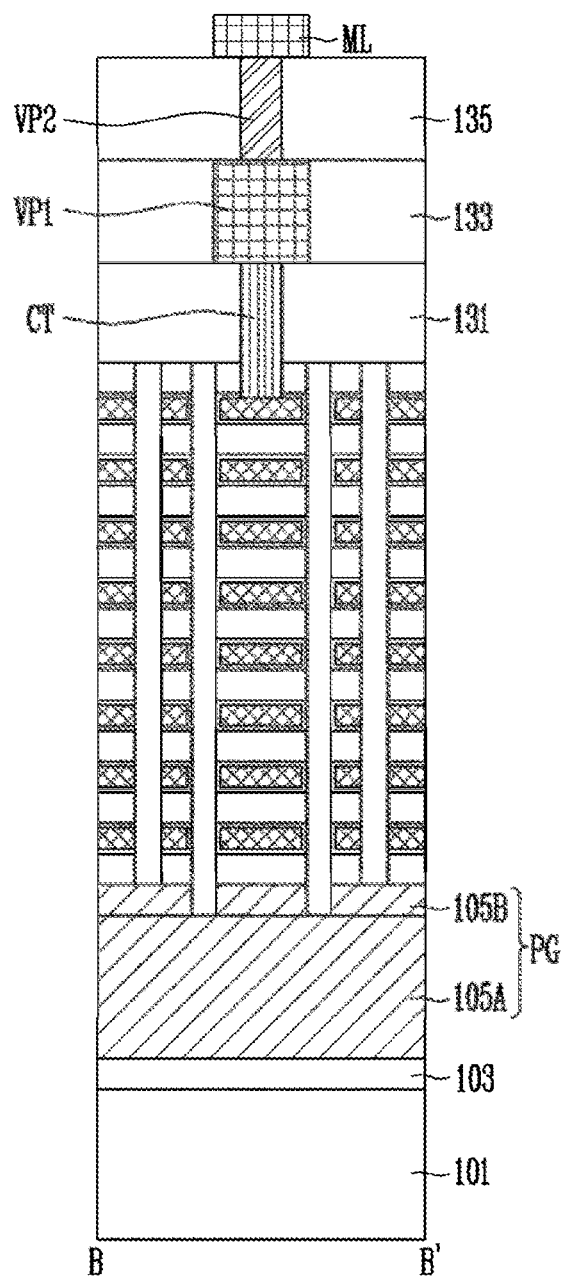
Figure 11C:
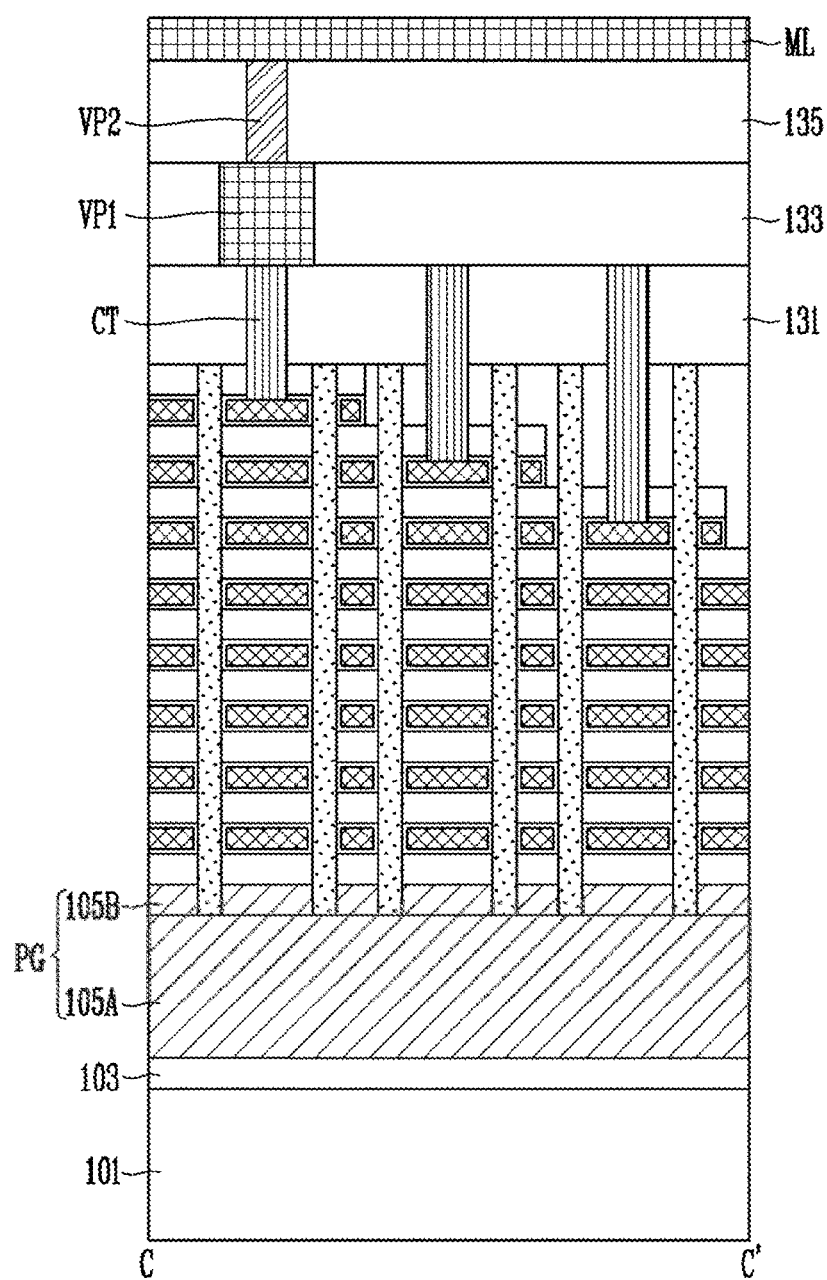

FIGS. 11A to 11C are sectional views illustrating an example of a process of forming conductive lines and conductive plugs of second and third groups. More specifically, the sectional views shown in FIGS. 11A to 11C are taken along the same lines as lines A-A', B-B', and C-C' shown in FIG. 10A, respectively.

Referring to FIGS. 11A to 11C, a second upper insulating layer 133 may be formed on the first upper insulating layer 131 including the conductive plugs DCT1, SCT, and CT of the first group. Subsequently, a trench and contact holes of a second group, which penetrate the second upper insulating layer 133, may be formed by etching the second upper insulating layer 133. The trench may expose the source contact plug SCT, and the contact holes of the second group may expose the cell contact plugs CT.

Subsequently, the trench and the contact holes of the second group are filled with a conductive material, thereby forming a common source line CSL and conductive plugs VP1 of a second group. The common source line CSL may come in contact with the source contact plug SCT, and the conductive plugs VP1 of the second group may come in contact with the cell contact plugs CT.

After that, a third upper insulating layer 135 may be formed on the second upper insulating layer 133 including the common source line CSL and the conductive plugs VP1 of the second group. Subsequently, contact holes of a third group, which penetrate at least one of the third upper insulating layer 135 and the second upper insulating layer 134, may be formed by etching the third upper insulating layer 135. The contact holes of the third group may expose the first drain contact plug DCT1 and the conductive plugs VP1 of the second group.

Subsequently, the contact holes of the third group may be filled with a conductive material, thereby forming conductive plugs DCT2 and VP2 of a third group. The conductive plugs of the third group may include a second drain contact plug DCT2 and via plugs VP2.

The second drain contact plug DCT2 may come in contact with the first drain contact plug DCT1 on the first drain contact plug DCT1. The via plugs VP2 may come in contact with the conductive plugs VP1 of the second group.

After that, metal lines ML connected to the via plugs VP2 on the via plugs VP2 and a bit line BL connected to the second drain contact plug DCT2 on the second drain contact plug DCT2 may be formed by using a conductive layer deposition process and an etching process.

Figure 12:
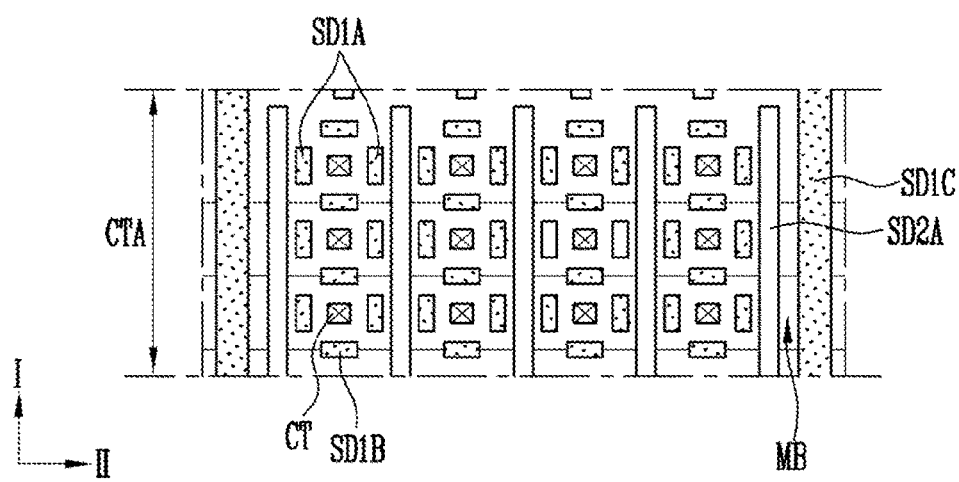
FIG. 12 is a plan view illustrating an example structure disposed at an upper portion of a contact area according to an embodiment of the present disclosure.

FIG. 12 is a plan view illustrating an example structure disposed at an upper portion of a contact area according to an embodiment of the present disclosure.

The structure disposed over a contact area CTA illustrated in FIG. 12 is a modification of the structure disposed over the first or second contact area CTA1 or CTA2 illustrated in FIG. 4A. Referring to FIG. 12, a stepped edge of a stacked structure of a memory block MB is disposed in the contact area CTA.

Contact plugs CT are disposed on the stepped edge of the stacked structure of the memory block MB. The contact plugs CT may transmit signals from the outside to conductive patterns constituting the stacked structure of the memory block MB. The contact plugs CT are connected to conductive patterns exposed through the stepped edge of the stacked structure of the memory block MB. The connection between the contact plugs CT and the conductive patterns may be the same as described in FIGS. 4C and 4D. The contact plugs CT may be arranged in a matrix form on the stepped edge of the stacked structure of the memory block MB.

The stepped edge of the stacked structure of the memory block MB may be penetrated by first slits and second slits. The first slits are respectively filled with first slit insulating layers SD1A to SD1C, and the second slits are filled with second slit insulating layers SD2A.

The first slit insulating layers SD1A to SD1C may serve as supports of the stacked structure of the memory block MB, and may be simultaneously formed. The first slit insulating layers disposed on the contact area CTA may be divided into first slit insulating layers SD1A to SD1C of first to third groups.

First slit insulating layers SD1A of the first group and first slit insulating layers SD1C of the third group may be formed in the same layout as illustrated in FIG. 4A. First slit insulating layers SD1B of the second group may be alternately disposed with the contact plugs CT along the first direction I. One of the first slit insulating layers SD1B of the second group is disposed between the contact plugs CT adjacent to each other in the first direction I, and thus it is possible to decrease the gap between the contact plugs CT arranged in the first direction I. Accordingly, the area occupied by the contact area CTA may be reduced.

The second slit insulating layers SD2A may be formed in the same layout as described in FIG. 4A.

Figure 13:
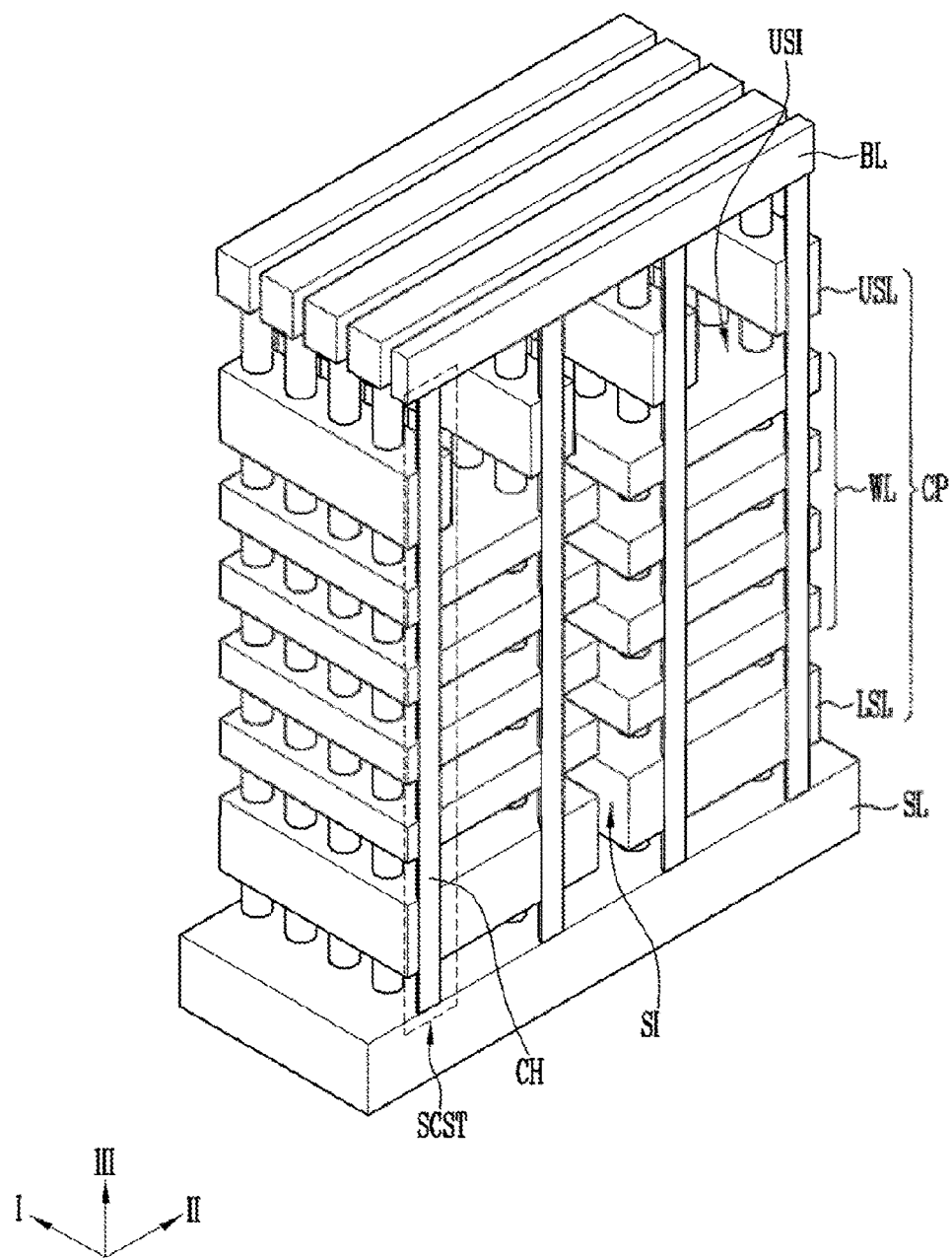
FIG. 13 is a perspective view illustrating an example structure of a memory string of a semiconductor device according to an embodiment of the present disclosure.

FIG. 13 is a perspective view illustrating an example structure of a memory string of a semiconductor device according to an embodiment of the present disclosure. For convenience of illustration, a plurality of insulating layers including tunnel insulating layers, data storage layers, blocking insulating layers, and interlayer insulating layers have been omitted from FIG. 13.

Referring to FIG. 13, each memory block of a memory cell block may include a straight-type memory string SCST. The straight-type memory string SCST may include a string channel layer CH and conductive patterns CP. The string channel layer CH may extend along one direction. The conductive patterns CP may surround the string channel layer CH, and may be stacked on top of one another interleaved with interlayer insulating layers (not illustrated).

The string channel layer CH may be electrically connected between a source layer SL and a bit line BL. The string channel layer CH is formed inside a vertical hole penetrating the conductive patterns CP. The string channel layer CH may be formed in a tubular shape surrounding a core insulating layer disposed in a central area of the vertical hole, or formed in an embedded shape filling the central area of the vertical hole. Although not illustrated, a tunnel insulating layer, a data storage layer, and a blocking insulating layer may be disposed between the string channel layer CH and the conductive patterns CP.

The bit line BL may be electrically connected to the top of the string channel layer CH, and may extend along the second direction II. The source layer SL may be directly connected to the bottom of the string channel layer CH. The source layer SL may be a portion of a semiconductor substrate doped with an impurity or a doped silicon layer formed on the semiconductor substrate.

The conductive pattern CP may be divided by a slit SI. The conductive patterns CP may include a lower select line LSL, word lines WL, and an upper select line USL, which are sequentially stacked along the string channel layer CH. For example, word lines WL, which is disposed over the lower select line LSL, may be stacked on top of one another interleaved with interlayer insulating layers (not illustrated), and upper select line USL may be disposed on an interlayer insulating layer formed on the uppermost source-side word line WL_S. The lower select line LSL may be disposed between the word lines WL and the source layer SL. The number of lower select lines USL stacked between the word lines WL and the source layer SL may be one. Alternatively, the number of lower select lines USL stacked between the word lines WL and the source layer SL may be two or more. The upper select line USL may be disposed between the word lines WL and the bit line BL. The number of upper select lines USL stacked between the word lines WL and the bit line BL may be one or two or more. Any one of the lower select line LSL and the upper select line USL may be isolated in smaller units than the word lines WL. For example, each of the word lines WL may be formed to surround string channel layers CH in two columns or more, and the upper select line USL may be formed to surround string channel layers CH in one column. In this case, the upper select line USL may be isolated by not only the slit SI but also an upper slit USI to have a narrower width than the word lines WL.

The conductive patterns CP may include both ends that extend toward upper portions of the contact areas CTA1 and CTA2 illustrated in FIG. 1 and form a step structure in the contact areas CTA1 and CTA2. The step structure of the conductive pattern CP may be the same as illustrated in FIG. 3.

According to the above-described structure, memory cells are formed at intersection portions of the string channel layer CH and the word lines WL, a lower select transistor is formed at an intersection portion of the string channel layer CH and the lower select line LSL, and an upper select transistor is formed at an intersection portion of the string channel CH and the upper select line USL. A lower select transistor, memory cells, and an upper select transistor, which are arranged in a line along one string channel layer CH, are connected in series to each other through the string channel layer CH, thereby constituting a straight-type memory string SCST. The word lines WL may transmit signals to gates of memory cells, the lower select line LSL may transmit signals to a gate of the lower select transistor, and the upper select line USL may transmit signals to a gate of the upper select transistor.

The conductive patterns illustrated in FIG. 13 may be penetrated by first slits, first slit insulating layers, second slits, and second slit insulating layers, which are disposed in the same layout as that illustrated in FIG. 4A or 12.

In an embodiment of the present disclosure, first slit insulating layers of a first group among the first slit insulating layers supporting material layers stacked while being spaced apart from each other are disposed opposite to each other in a direction intersecting the extending direction of the contact area. Also, in an embodiment of the present disclosure, second slits of a first group, which are disposed on the contact area among the second slits that become paths for an etching material, are disposed at opposite sides of the first slit insulating layers of the first group.

According to an embodiment of the present disclosure, at least one pair of first slit insulating layers of the first group, which serve as supports, may be disposed between the second slits of the first group. Thus, even if a pad area has an opening by removing material layers between interlayer insulating layers through the second slits of the first group, the pad area can be firmly supported by the first slit insulating layers of the first group, which are disposed at opposite sides of the pad area. As a result, in an embodiment of the present disclosure, it is possible to reduce a probability of pattern collapse of the pad area having openings during a manufacturing process of the semiconductor device. Also, it is possible to reinforce the structural stability of a three-dimensional stacked structure of a semiconductor memory device.

Figure 14:
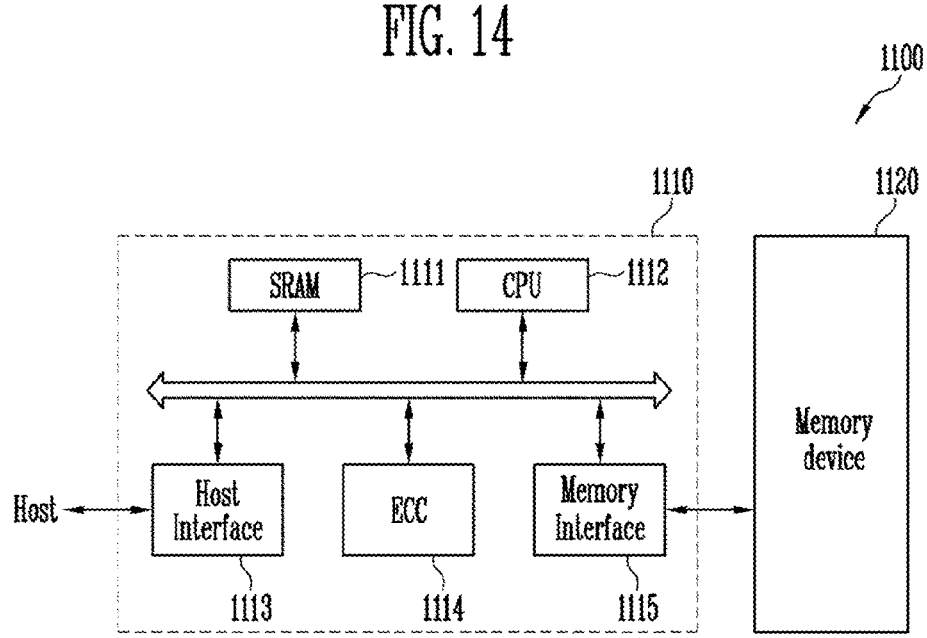
FIG. 14 is a diagram illustrating an example of a memory system according to an embodiment of the present disclosure.

FIG. 14 is a diagram illustrating an example of a memory system according to an embodiment of the present disclosure.

The memory system 1100 according to an embodiment of the present disclosure includes a memory device 1120 and a memory controller 1110.

The memory device 1120 may include a substrate including a cell area and a contact area extending along a first direction from the cell area; conductive patterns stacked while being spaced apart from each other on the substrate so as to form a step structure on the contact area; contact plugs coming in contact with the respective conductive patterns to extend along the stacked direction of the conductive patterns; first slit insulating layers of a first group, which are disposed at opposite sides of any one of the contact plugs in a second direction intersecting the first direction, and penetrate the conductive patterns; and second slit insulating layers of a first group, which extend along the first direction on the contact area to penetrate the conductive patterns, and are disposed in the second direction at opposite sides of the first slit insulating layers of the first group and the contact plugs. Also, the memory device 1120 may be a multi-chip package formed of a plurality of flash memory chips.

The memory controller 1110 may control the memory device 1120, and may include an SRAM 1111, a CPU 1112, a host interface 1113, an ECC 1114, and a memory interface 1115. The SRAM 1111 may be used as an operation memory of the CPU 1112, the CPU 1112 may perform a general control operation for data exchange of the memory controller 1110, and the host interface 1113 may include a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1110 may communicate with the outside (e.g., the host) through one of various interface protocols, such as USB, MMC, PCI-E, SATA, PATA, SCSI, ESDI, and IDE.

Figure 15:
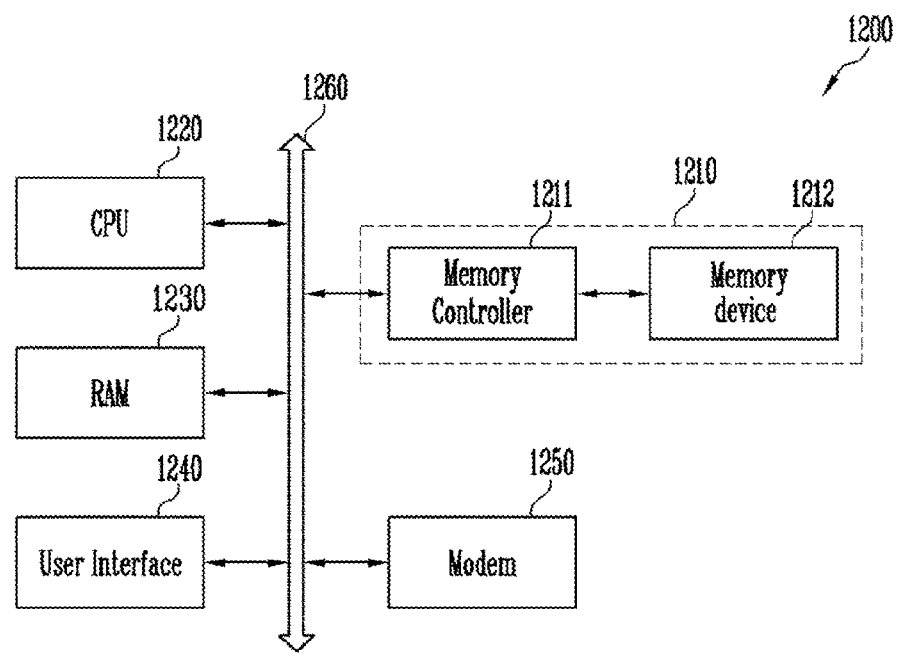
FIG. 15 is a diagram illustrating an example of a computing system according to an embodiment of the present disclosure.

FIG. 15 is a configuration diagram illustrating an example of a computing system according to an embodiment of the present disclosure.

Referring to FIG. 15, the computing system 1200 according to the embodiment of the present disclosure may include a CPU 1220, a RAM 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 14, may be configured with a memory device 1212 and a memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
    a substrate including a cell area and a contact area extending along a first direction from the cell area;
    conductive patterns stacked to be spaced apart from each other on the substrate and forming a step structure in the contact area;
    contact plugs coming in contact with the respective conductive patterns and extending along a direction along which the conductive patterns are stacked;
    first slit insulating layers of a first group disposed opposite to each other in a second direction intersecting the first direction with any one of the contact plugs, interposed therebetween, the first slit insulating layers of a first group penetrating the conductive patterns; and
    second slit insulating layers of a first group, which extend along the first direction in the contact area to penetrate the conductive patterns, and are disposed opposite to each other in the second direction with the first slit insulating layers of the first group and the contact plugs, interposed therebetween.

2. The semiconductor device of claim 1, further comprising first slit insulating layers of a second group, which are disposed opposite to each other in the first direction with any one of the contact plugs, interposed therebetween, and disposed between the second slit insulating layers of the first group to penetrate the conductive patterns.

3. The semiconductor device of claim 2, wherein the first slit insulating layers of the second group and the contact plugs are alternately disposed along the first direction.

4. The semiconductor device of claim 2, further comprising first slit insulating layers of a third group, which extend along the first direction, are disposed opposite to each other in the second direction, and isolate the conductive patterns to form stacked structures of memory blocks.

5. The semiconductor device of claim 4, wherein the first slit insulating layers of the first group, the second slit insulating layers of the first group, and the first slit insulating layers of the second group are spaced apart from each other between the first slit insulating layers of the third group.

6. The semiconductor device of claim 1, further comprising:
    channel layers penetrating the conductive patterns on the cell area; and
    second slit insulating layers of a second group, which penetrate the conductive patterns between the channel layers, and extend along the first direction.

7. The semiconductor device of claim 1, wherein the first slit insulating layers of the first group are formed to have a different depth from the second slit insulating layers of the first group.

8. The semiconductor device of claim 1, further comprising blocking insulating layers respectively disposed between the conductive patterns and the first slit insulating layers, the blocking insulating layers extending along the shape of surfaces of the conductive patterns.

9. The semiconductor device of claim 8, wherein the blocking insulating layers in a shape that has openings at sidewalls of the conductive patterns, which face the second slit insulating layers of the first group.

10. The semiconductor device of claim 1, wherein the second slit insulating layers of the first group come in contact with the sidewalls of the conductive patterns.

11. A method of manufacturing a semiconductor device, the method comprising:
    alternately stacking first material layers and second material layers on a substrate including a cell area and a contact area extending along a first direction from the cell area;
    forming a step structure on the contact area by etching at least a portion of the first material layers and the second material layers;
    forming a planarization insulating layer covering the step structure;
    forming, in the contact area, first slit insulating layers of a first group, which penetrate the planarization insulating layer, the first material layers, and the second material layers, and are disposed opposite to each other in a second direction intersecting the first direction; and
    forming second slits of a first group, which extend along the first direction to penetrate the first material layers and the second material layers, and are disposed opposite to each other in the second direction with the first slit insulating layers of the first group adjacent to each other in the second direction, which are interposed therebetween.

12. The method of claim 11, further comprising simultaneously forming, together with the first slit insulating layers of the first group, first slit insulating layers of a second group, which are disposed opposite to each other in the first direction with a pad area defined between the first slit insulating layers of the first group adjacent to each other in the second direction, which are interposed therebetween, and are spaced apart from the first slit insulating layers of the first group.

13. The method of claim 11, further comprising simultaneously forming, together with the first slit insulating layers of the first group, first slit insulating layers of a third group, which isolate the first material layers and the second material layers in units of memory blocks.

14. The method of claim 11, further comprising:
before forming the second slits of the first group, forming channel layers penetrating the first material layers and the second material layers in the cell area; and
simultaneously forming, together with the second slits of the first group, second slits of the second group, which penetrate the first material layers and the second material layers between the channel layers, and extend along the first direction.

15. The method of claim 14, further comprising:
forming openings by selectively removing at least a portion of the second material layers exposed through the second slits of the first and second groups;
forming a blocking insulating layer along surfaces of the openings; and
forming third material layers in the respective openings on the blocking insulating layer.

16. The method of claim 15, wherein the openings are formed to expose sidewalls of the first slit insulating layers of the first group.

17. The method of claim 15, further comprising forming a contact plug disposed between the first slit insulating layers of the first group, which are adjacent to each other in the second direction, the contact plug penetrating at least one of the planarization insulating layer and the first material layers to come in contact with any one of the third material layers.

18. The method of claim 17, wherein the contact plug penetrates the blocking insulating layer.

19. The method of claim 11, wherein the second slits of the first group are formed to have a different depth from the first slit insulating layers of the first group.

* * * * *